(12) United States Patent
Kobayashi

(10) Patent No.: US 8,862,259 B2
(45) Date of Patent: Oct. 14, 2014

(54) PROCESSING DATA MANAGING SYSTEM, PROCESSING SYSTEM, AND PROCESSING DEVICE DATA MANAGING METHOD

(75) Inventor: Takumi Kobayashi, Singapore (SG)

(73) Assignee: Hoya Corporation, Tokyo (JP)

( * ) Notice: Subject to any disclaimer, the term of this patent is extended or adjusted under 35 U.S.C. 154(b) by 1499 days.

(21) Appl. No.: 12/295,617

(22) PCT Filed: Mar. 30, 2007

(86) PCT No.: PCT/JP2007/057087
§ 371 (c)(1),
(2), (4) Date: Sep. 30, 2008

(87) PCT Pub. No.: WO2007/114332
PCT Pub. Date: Oct. 11, 2007

(65) Prior Publication Data
US 2009/0287335 A1    Nov. 19, 2009

(30) Foreign Application Priority Data

Mar. 31, 2006    (JP) .................................. 2006-101212

(51) Int. Cl.
| | |
|---|---|
| *G06F 19/00* | (2011.01) |
| *G06F 11/30* | (2006.01) |
| *C23C 14/00* | (2006.01) |
| *G11B 5/851* | (2006.01) |
| *G11B 5/85* | (2006.01) |
| *G05B 19/418* | (2006.01) |
| *C23C 14/54* | (2006.01) |
| *C23C 14/34* | (2006.01) |

(52) U.S. Cl.
CPC .......... *G05B 19/41875* (2013.01); *G11B 5/851* (2013.01); *G11B 5/85* (2013.01); *C23C 14/54* (2013.01); *C23C 14/34* (2013.01)
USPC ........ 700/108; 700/121; 702/183; 204/192.3; 204/298.03

(58) Field of Classification Search
USPC .................. 700/108, 121; 702/183, 185, 187; 204/193.12, 193.13, 298.03, 193.2
See application file for complete search history.

(56) References Cited

U.S. PATENT DOCUMENTS

| | | | |
|---|---|---|---|
| 6,338,777 B1 * | 1/2002 | Longstreth White | .... 204/192.15 |
| 6,741,941 B2 * | 5/2004 | Obara et al. | .................... 702/35 |

(Continued)

FOREIGN PATENT DOCUMENTS

| | | |
|---|---|---|
| CN | 1362660 A | 8/2002 |
| EP | 1220529 A2 | 7/2002 |

(Continued)

OTHER PUBLICATIONS

Chinese Office Action corresponding to Chinese Patent Application No. 200780011630.7, dated May 19, 2010.

(Continued)

*Primary Examiner* — Darrin Dunn
(74) *Attorney, Agent, or Firm* — Sughrue Mion, PLLC

(57) ABSTRACT

A processing data managing system includes: a processing device 11 (such as a sputtering device for manufacturing a magnetic disc) for repeating the same process for each cycle; a sampling unit 30 for collecting raw data on a processing condition in the processing device (such as a discharge condition); a calculation unit 100 for receiving the raw data, calculating the raw data according to a predetermined rule, and processing it as summary data expressing a characteristic point for each cycle (characteristic value: for example, average value, maximum value, minimum value, standard deviation, discharge time, and the like); a data storage unit 40 for storing the processed summary data in storage means; and a display/output unit 50 for chart-displaying the summary data stored in the storage means.

9 Claims, 20 Drawing Sheets

(56) References Cited

U.S. PATENT DOCUMENTS

| | | | |
|---|---|---|---|
| 6,772,034 B1* | 8/2004 | Shi et al. | 700/121 |
| 6,871,112 B1* | 3/2005 | Coss et al. | 700/121 |
| 6,920,405 B2* | 7/2005 | Lawrence | 702/83 |
| 7,580,768 B2* | 8/2009 | Muenz | 700/109 |
| 7,831,326 B2* | 11/2010 | Lin et al. | 700/108 |
| 2001/0050220 A1* | 12/2001 | Chiang et al. | 204/192.12 |
| 2003/0183509 A1* | 10/2003 | Braeckelmann | 204/192.17 |
| 2004/0026235 A1* | 2/2004 | Stowell, Jr. | 204/192.12 |
| 2004/0182696 A1* | 9/2004 | Kuriyama et al. | 204/298.03 |
| 2004/0182697 A1* | 9/2004 | Buda | 204/298.08 |
| 2005/0159835 A1* | 7/2005 | Yamada et al. | 700/109 |
| 2005/0165731 A1* | 7/2005 | Funk | 707/1 |
| 2005/0177269 A1* | 8/2005 | Funk | 700/121 |
| 2005/0187649 A1* | 8/2005 | Funk et al. | 700/121 |
| 2005/0205413 A1* | 9/2005 | Ikari et al. | 204/192.13 |
| 2005/0236266 A1* | 10/2005 | Poole et al. | 204/192.13 |
| 2005/0278597 A1* | 12/2005 | Miguelanez et al. | 714/738 |
| 2006/0071673 A1* | 4/2006 | Lang | 324/663 |
| 2006/0167653 A1* | 7/2006 | Asano | 702/179 |
| 2006/0184264 A1* | 8/2006 | Willis et al. | 700/108 |
| 2007/0038889 A1* | 2/2007 | Wiggins et al. | 714/20 |
| 2007/0102291 A1* | 5/2007 | Hartig | 204/298.16 |
| 2008/0021664 A1* | 1/2008 | Krauss et al. | 702/65 |
| 2008/0082294 A1* | 4/2008 | Pihlaja et al. | 702/179 |
| 2009/0292506 A1* | 11/2009 | MacDonald et al. | 702/185 |

FOREIGN PATENT DOCUMENTS

| | | |
|---|---|---|
| JP | 11-162851 A | 6/1999 |
| JP | 11-316950 A | 11/1999 |
| JP | 2002-294444 A | 10/2002 |
| JP | 2004-186445 A | 7/2004 |

OTHER PUBLICATIONS

Japanese Office Action corresponding to Japanese Patent Application No. 2006-101212, dated Apr. 10, 2012.

* cited by examiner

PROCESSING DATA MANAGING SYSTEM, PROCESSING SYSTEM, AND PROCESSING DEVICE DATA MANAGING METHOD

TECHNICAL FIELD

This invention relates to a processing data managing system that is mainly applied to a manufacturing site or the like for high recording density magnetic disks, a processing system including such a processing data managing system, and a data managing method for a processing device or apparatus such as a magnetic disk manufacturing apparatus.

BACKGROUND ART

In recent years, the increase in magnetic disk recording density has been remarkable. A high recording density magnetic disk is manufactured through processes of forming a plurality of magnetic layers over the surface of a substrate. Since an underlayer and a protective layer are respectively provided under and over each of the magnetic layers, the magnetic disk is manufactured through a number of film forming processes. Therefore, in the manufacture of the magnetic disk, use is made of a processing device having a structure with a number of processing chambers arranged for carrying out the respective processes.

For example, when manufacturing one magnetic disk, a disk (substrate) is caused to pass through the number of processing chambers in order so as to be subjected to a predetermined process treatment in each of the processing chambers. In each processing chamber, one-time process treatment is given as one cycle and the same process treatment is repeated each time a disk passes therethrough, and, after the treatment, the disk is sent out to the next processing chamber. Then, a magnetic disk having gone through all the processes is sent out from the final processing chamber.

A sputtering device or apparatus is mainly used as the manufacturing apparatus (processing device) for such high recording density magnetic disks. The sputtering apparatus generates glow discharge by introducing a discharge gas into a vacuum and applying the power to electrodes so as to form a thin film of a target metal on the surface of a disk by collision of ions in a plasma generated by the glow discharge.

In each of processing chambers of the sputtering apparatus, there is a case where film formation is performed on one surface of a single disk, a case where film formation is performed on both surfaces of a single disk, a case where film formation is performed on one surface of each of two disks, a case where film formation is performed on both surfaces of each of two disks, or the like. For example, when simultaneously performing film formation on both surfaces of each of two disks in one processing chamber, it is necessary to provide four cathode electrodes for generating discharge and to apply the power to each of the electrodes.

In the meantime, when manufacturing magnetic disks of this type, it is important to store histories of the manufacturing processes. This is because if a defective product is produced due to occurrence of some abnormality in the manufacturing process, it is possible to pursue a cause thereof later and to promptly correct it.

At a conventional magnetic disk manufacturing site, process-treatment condition data (discharge condition, gas pressure, substrate temperature, etc.) are sampled and the sampled raw data are, as they are, displayed in a graph or the like or stored in storage means. Then, if a defective product is produced, the raw data extracted according to an index of a disk or a lot are, for example, displayed in a graph on a display screen in time sequence, thereby enabling an analysis while observing waveforms in the graph.

FIG. 17 is a block diagram exemplarily illustrating the configuration of a conventional magnetic disk manufacturing system (processing system).

This manufacturing system comprises a processing device (sputtering apparatus) 10 for sputtering a disk being a workpiece W, a control unit 20 for controlling the processing device 10, a sampling unit (raw data collecting means) 30 for collecting raw data on processing conditions (power supply output and gas pressure for generating discharge, substrate temperature, etc.) in the sputtering, a data storage unit (data storage means) 40 for storing the collected data in recording means, and a display/output unit (display means) 50 for displaying in a chart or outputting to another output means the collected data or the stored data according to need.

The processing device 10 is provided with a processing chamber 11 for carrying out a necessary process treatment, a processing unit 12 for carrying out the treatment, a sensor 13 for monitoring the processing state, and so on. Raw data output from the processing unit 12 and the sensor 13 are input into the sampling unit 30. The data output from the sensor 13 and the processing unit 12 may be analog data or digital data. In the sampling unit 30, the raw data are properly converted into a form (digital data form) readable by the data storage unit 40 and the display/output unit 50. Thereafter, the converted data are stored or displayed/output.

The actual magnetic disk manufacturing processing is carried out through a plurality of processes in sequence. Therefore, in the processing device 10, a plurality of processing chambers 11 are arranged so that thin films can be formed on the surface of a disk in a predetermined order. In each of the processing chambers 11, the same process treatment is repeated for each cycle. Since, in this case, the processing device 10 is configured to form magnetic disk thin films on the surface of a disk (substrate) by generation of discharge in the processing chambers 11 each maintained in a predetermined gas pressure atmosphere, respective treatments for forming the thin film are carried out in order in each processing chamber 11.

The sampling unit 20 collects raw data on processing conditions in the processing device 10 and, herein, collects raw data on processing conditions in thin film forming treatments for a number of magnetic disks. For example, it collects raw data such as power supply outputs (power, voltage, current) for generating discharge, gas pressures in the processing chambers 11, and disk temperatures at regular sampling intervals.

Incidentally, in such treatments, acquisition (sampling) of raw data is often performed a plurality of times in the treatment of one process (cycle) in each processing chamber 11. This is for examining time-dependent changes of various parameters in one cycle in detail and, particularly, with respect to such a parameter that largely affects the processing results, it is necessary to carefully observe a change in one process and thus the sampling is performed this way.

When the data thus collected are displayed in time sequence, there is obtained, for example, a graph like FIG. 18. In FIG. 18, the axis of abscissas represents time and the axis of coordinates represents measured value such as discharge voltage.

In the case of this example, the respective components correspond to the following specific means.

| (Name) | (Example of Specific Means) |
|---|---|
| processing device 10 | sputtering apparatus |
| processing region | inside of chamber (processing chamber 11) |
| processing unit 12 | sputtering cathode, discharge power supply, etc. |
| sensor 13 | pressure gauge etc. |
| control unit 20 | PLC |
| sampling unit 30 | A/D converter |
| display/output unit 50 | computer |
| data storage unit 40 | hard disk drive |

DISCLOSURE OF THE INVENTION

Problem to be Solved by the Invention

In the manufacture of high density recording magnetic disks using the manufacturing system described above, the requirement for the film forming quality (film thickness and film property) is quite strict and, therefore, it is necessary to shorten the sampling interval in one cycle or increase the number of sampling items (parameters).

Specifically, for example, one cycle is set to 6 seconds and sampling is performed 40 times in one second. As detection items (parameters), there are power, voltage, and current with respect to the power supply output and, in addition, there are gas pressure and disk temperature. When simultaneously processing two front and back surfaces of each of two disks in one processing chamber 11, the number of cathodes is four. Therefore, there are 3 items×4=12 items with respect to the power supply output and, adding one item of gas pressure and two items of temperature of the two disks, it is necessary to obtain raw data on the 15 items in total in each processing chamber 11. Thus, the amount of raw data collected over the entire processing device 10 having the number of processing chambers 11 becomes quite enormous.

Besides, since waveforms of raw data are merely graph-displayed as they are in the conventional system, there has been a case where it is difficult to perform an analysis and thus to find a problem.

Under these circumstances, it is possible to point out that the conventional magnetic disk manufacturing system has the following problems (1), (2), and (3).

(1) There is a case where it is difficult to detect abnormality even by observing waveforms of raw data on a screen and, particularly because of enormous data, there is a case where if a reduced display is performed over a long-term span, it is possible to see the whole, but is not possible to read details, while, if an enlarged display is performed in a short-term span, it is possible to see details, but is difficult to read a long-term change or the like.

That is, raw data are plotted in a graph as they are in the conventional manufacturing system. FIG. 19 is a graph with a reduced display over a long-term span and FIG. 20 is a graph with an enlarged display in a short-term span. As illustrated in FIG. 19, when long-time data are graph-displayed, since the display becomes dense, it is difficult to grasp individual waveforms. Conversely, as illustrated in FIG. 20, when short-time data are graph-displayed, the number of cycles that can be displayed on a display screen at a time is reduced and thus it is difficult to grasp a long-term change.

Accordingly, by the current data managing method, when abnormality occurs in data, it is difficult to find an abnormality occurring portion. That is, it is difficult to compare one-cycle waveforms and it is difficult to confirm a waveform long-term change.

(2) An acceptance/rejection judgment is difficult only by observing raw data waveforms.

That is, when using this type of raw data, a method is often adopted in which a human being observes waveforms to judge acceptance or rejection of a treatment. In this case, if the cycle is about one cycle per day to about one cycle per hour, it is easy for a human being to confirm each time, but if faster, i.e. when one cycle is as short as 6 seconds as in this example, it is necessary to confirm a raw data waveform per 6 seconds by visual observation and thus it is difficult for a human being to continue the observation for a long time.

As a measure for this, it is considered to provide upper and lower limit alarm values and to generate an alarm when one of them is exceeded. When a plurality of processing devices are used in parallel, it is practically impossible to judge acceptance or rejection by visual observation and, therefore, such an alarm function is essential. However, with this alarm function, it is not possible to grasp a change within a range not exceeding the alarm set values.

(3) Since the amount of raw data becomes enormous, data storage is difficult.

That is, in the foregoing conventional manufacturing system, if raw data are successively stored into the data storage unit 40, the data amount becomes enormous. Therefore, it is necessary to provide a large-capacity data storage unit 40 or it is necessary to record data into another backup medium per fixed period of time and then to erase the stored contents to ensure a free area. Although such raw data include useful information, it is not that the raw data itself at each point includes useful information. Useful information is a certain kind of information included in the entire waveform and is not individual raw data themselves. That is, it is wasteful to store the raw data as they are.

Therefore, in consideration of the above circumstances, it is an object of this invention to provide a processing data managing system that can solve the above problems by processing raw data into summary data (hereinafter may also be referred to as a characteristic value) representing a characteristic point for each cycle and then storing it, a processing system including such a processing data managing system, and a data managing method for a processing device such as a magnetic disk manufacturing apparatus.

Means for Solving the Problem

According to structure 1 of this invention, there is provided a processing data managing system comprising:

data processing means for receiving raw data on a processing condition collected in a processing device that repeats the same process treatment for each cycle and calculating said raw data according to a predetermined rule to thereby process said raw data into summary data representing a characteristic point for each cycle, and data storage means for storing the processed summary data in storage means.

According to structure 2 of this invention, there is provided a processing data managing system comprising:

data processing means for receiving raw data on a processing condition collected in a processing device that repeats the same process treatment for each cycle and calculating said raw data according to a predetermined rule to thereby process said raw data into summary data representing a characteristic point for each cycle, and display means for chart-displaying the processed summary data.

According to structure 3 of this invention, there is provided a processing data managing system comprising:

data processing means for receiving raw data on a processing condition collected in a processing device that repeats the same process treatment for each cycle and calculating said raw data according to a predetermined rule to thereby process said raw data into summary data representing a characteristic point for each cycle, data storage means for storing the processed summary data in storage means, and display means for chart-displaying the summary data output from said data processing means or the summary data stored in said storage means.

According to structure 4 of this invention, there is provided a processing data managing system according to any of structures 1 to 3, wherein:

said raw data is raw data on processing conditions of thin film forming treatments for a number of workpieces, and said summary data is data reduced in size by converting said raw data on the processing conditions of the thin film forming treatments according to a predetermined analysis point of view.

According to structure 5 of this invention, there is provided a processing data managing system according to structure 4, wherein:

said raw data is raw data on processing conditions of thin film forming treatments for a number of magnetic disks, and said summary data is data reduced in size by converting said raw data on the processing conditions of the thin film forming treatments for the number of magnetic disks according to a predetermined analysis point of view.

According to structure 6 of this invention, there is provided a processing system comprising:

a processing device that repeats the same process treatment for each cycle, raw data collecting means for collecting raw data on a processing condition in said processing device, and the processing data managing system according to any of structure 1 to 5 for managing the raw data collected by said raw data collecting means.

According to structure 7 of this invention, there is provided a processing system according to structure 6, wherein:

said processing device is a thin film forming apparatus for forming a thin film on a surface of a substrate by generation of discharge in a processing chamber maintained in a predetermined gas pressure atmosphere, said raw data collecting means collects, at regular sampling intervals, at least raw data on a power supply output for generating the discharge, and said processing data managing system, based on said raw data on the power supply output, repeatedly calculates summary data, for each cycle, on at least one of items such as a discharge ON time and an average value, a maximum value, a minimum value, and a standard deviation of the power supply output and displays or stores said summary data.

According to structure 8 of this invention, there is provided a processing system according to structure 7, wherein:

said processing device is provided with a plurality of electrodes in the processing chamber for discharge generation, and said raw data collecting means collects raw data on a power supply output for discharge generation for each of said electrodes.

According to structure 9 of this invention, there is provided a processing system according to structures 7 or 8, wherein:

said processing device comprises a plurality of processing chambers for forming thin films on the substrate in a predetermined order, and said raw data collecting means collects raw data on a power supply output for discharge generation for each of said processing chambers.

According to structure 10 of this invention, there is provided a processing system according to any of structures 7 to 9, wherein:

said thin film forming apparatus is a magnetic disk manufacturing apparatus.

According to structure 11 of this invention, there is provided a processing device data managing method comprising:

a step of collecting raw data on a process treatment condition in a processing device that repeats the same process treatment for each cycle, a step of calculating the collected raw data according to a predetermined rule to thereby process said raw data into summary data representing a characteristic point for each cycle, and a step of storing the processed summary data in storage means.

According to structure 12 of this invention, there is provided a processing device data managing method comprising:

a step of collecting raw data on a process treatment condition in a processing device that repeats the same process treatment for each cycle, a step of calculating the collected raw data according to a predetermined rule to thereby process said raw data into summary data representing a characteristic point for each cycle, and a step of chart-displaying the processed summary data.

According to structure 13 of this invention, there is provided a processing device data managing method according to structure 11 or 12, wherein:

said process treatment in said processing device is a thin film forming treatment for forming a magnetic disk thin film on a surface of a substrate by generation of discharge in a processing chamber maintained in a predetermined gas pressure atmosphere.

Effect of the Invention (1) By using summary data, it is possible to easily grasp a change in processing state for each cycle. That is, it is possible to easily provide an analysis edge in a form suitable for analysis.

(2) By using summary data, it is possible to perform an acceptance/rejection judgment that is difficult with raw data, which thus is useful for preventing the occurrence of a defective product or judging a failure.

(3) By storing summary data, it is possible to reduce the data storage amount. Therefore, it is highly effective for the manufacture of high recording density magnetic disks where an extremely large amount of raw data are produced.

DESCRIPTION OF SYMBOLS

Figure 1:
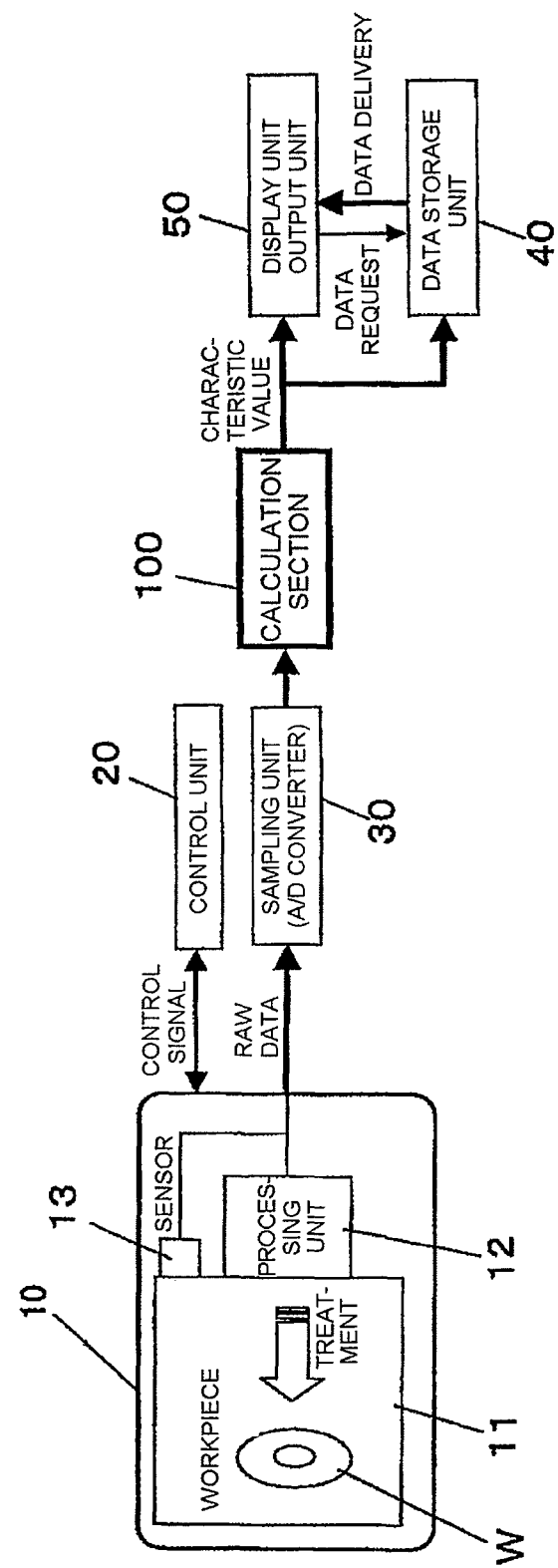
FIG. 1 is a block diagram exemplarily illustrating the configuration of a magnetic disk manufacturing system (processing system) according to an embodiment of this invention.

10 processing device
11 processing chamber
12 processing unit
13 sensor
20 control unit
30 sampling unit (data collecting means)
40 data storage unit (data storage means)
50 display/output unit (display means)
100 calculation section (data processing means)

BEST MODE FOR CARRYING OUT THE INVENTION

Hereinbelow, an embodiment of this invention will be described.

At first, to give a schematic description, the raw data described above include important information indicative of the stability of discharge. A point of this invention is how well to extract and display such data to thereby reduce the total data size.

For example, from the power supply output raw data, it is possible to calculate a discharge time, the average power during a discharge period of time, and so on. That is, it is considered that the discharge characteristics can be represented by a small number of data extracted from one-cycle raw data.

Naturally, the raw data include detailed information not included in these extracted data, for example, discharge leading and trailing states, the power stability during discharge, and so on. However, if some numerical values are obtained by processing the raw data as described above, these values can be plotted instead of the raw data and, by extensively continuing the plotting, it is possible to visually grasp time-dependent changes in discharge time and average power, for example. In this case, since one cycle is represented by plot data at one point, it is possible to display a relatively long-time tendency on one screen and, further, it is also possible to largely reduce the data size.

The discharge leading state and so on each can also be represented by one numerical value through proper calculation, but herein, some values (in this specification, referred to as "summary data" or "characteristic values") representing the discharge characteristics other than those are extracted from the raw data, thereby precisely visualizing time-dependent changes of the data and reducing the data size.

In this embodiment, as characteristic values representing such discharge characteristics, items of
discharge time
output standard deviation during discharge
output average value, minimum value, and maximum value during discharge
are employed. In addition thereto, it is considered to also employ the number of times of abnormal discharge (counting rapid output drops).

FIG. 1 is a block diagram exemplarily illustrating the configuration of a magnetic disk manufacturing system (processing system) according to the embodiment of this invention.

This manufacturing system comprises a processing device (sputtering apparatus) 10 for sputtering a disk being a workpiece W, a control unit 20 for controlling the processing device 10, a sampling unit (raw data collecting means) 30 for collecting raw data on processing conditions (power supply output and gas pressure for generating discharge, substrate temperature, etc.) in the sputtering, a calculation section 100 as data processing means for receiving the collected raw data and calculating the raw data according to a predetermined rule to thereby process the raw data into summary data representing a characteristic point for each cycle, a data storage unit (data storage means) 40 for storing the processed summary data in recording means, and a display/output unit (display means) 50 for displaying in a chart or outputting to another output means the collected data or the stored data according to need.

In terms of a data managing method, the sampling unit 30 executes a step of collecting raw data on the processing conditions, the calculation section 100 executes a step of calculating the raw data according to the predetermined rule to thereby process the raw data into summary data representing a characteristic point for each cycle, the data storage unit 40 executes a step of storing the summary data in the storage means, and the display/output unit 50 executes a step of chart-displaying the summary data stored in the storage means.

Herein, a group comprising the calculation section 100, the data storage unit 40, and the display/output unit 50 can be separated from the processing device 10 side so as to be independent as a processing data managing system. Further, among them, it is possible to separate the calculation section 100 and the data storage unit 40 from the display/output unit 50. Separation means independence both spatially and temporally.

The summary data are data reduced in size by converting the raw data on the processing conditions of the sputtering (thin film forming treatment) according to the predetermined analysis point of view and are specifically, as described above, the discharge ON time and the power supply output average value, maximum value, minimum value, and standard deviation calculated on the basis of the power supply output.

The processing device 10 is provided with a processing chamber 11 for carrying out a necessary process treatment, a processing unit 12 for carrying out the treatment, a sensor 13 for monitoring the processing state, and so on. Raw data output from the processing unit 12 and the sensor 13 are input into the sampling unit 30. Data output from the sampling unit 30 are processed in the calculation section 100 and then input into the data storage unit 40 and the display/output unit 50. Naturally, it may be configured to display/output the raw data, in the form not processed in the calculation section 100, in/to the display/output unit 50.

As is clear from the block diagram of FIG. 1, a feature of this manufacturing system resides in providing the calculation section 100 after the sampling unit 30. This calculation section 100 may be formed by a digital signal processing circuit or an analog operational circuit, but herein, a description will be given of a case where it is formed by a software-driven computer.

The calculation section 100 converts raw data for one cycle into a value representing its characteristics (this is called a "characteristic value" and corresponds to "summary data" in claims). It is possible to define a plurality of characteristic values with respect to one-cycle raw data for one measurement item (parameter) and, herein, as an example, five characteristic values of average value, maximum value, minimum value, standard deviation, and discharge ON time are defined with respect to the discharge voltage.

Figure 2:
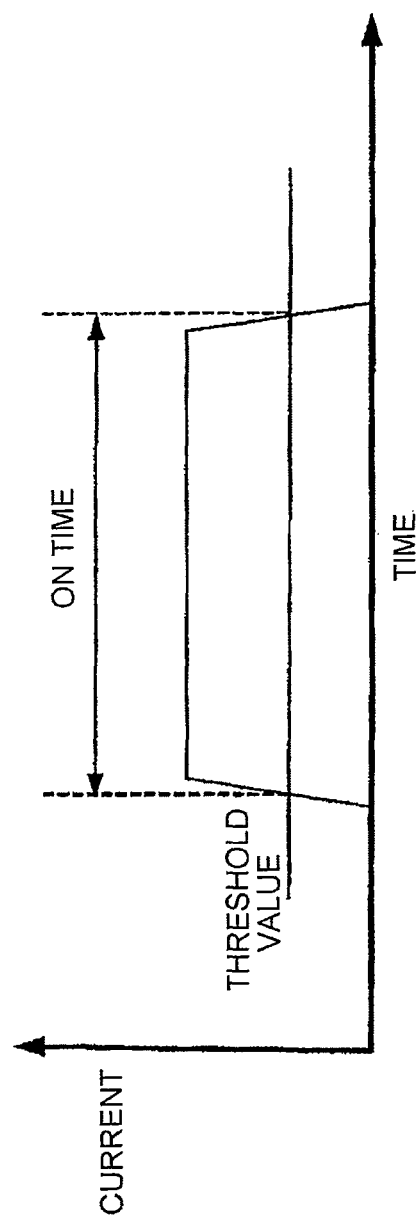
FIG. 2 is a diagram for explaining a criterion when calculating a characteristic value (summary data) for each cycle.

The calculation section 100 starts calculation by an external or internal trigger signal, finishes the calculation by a calculation end trigger, and outputs obtained characteristic values. An example of internal triggers is as follows. That is, when input data satisfies a predetermined condition, the calculation is started and, when input data does not satisfy the condition, the calculation is finished. Specifically, as illustrating in FIG. 2 as an example the case where an ON time is judged based on a discharge current, the measurement is started when the current exceeds a certain threshold value and the measurement is finished when the current becomes less than the threshold value.

When values during processing (during discharge) and during non-processing (during non-discharge) differ from each other like the discharge voltage, data calculation can be automatically started and finished by internal triggers based on a threshold value. However, for a parameter whose value does not change between during processing and during non-processing or whose variation is greater than a difference between during processing and during non-processing, internal triggers cannot be used. In such a case, calculation is started in response to a threshold value of another parameter or calculation is started by a cycle-synchronous calculation start command from the control unit 20. As an example of such a parameter, there is a "gas pressure". Although depending on the process conditions, the pressure takes substantially the same value both during processing and during non-processing and thus it is difficult to perform calculation based on a threshold value.

The characteristic values calculated in the calculation section 100 are output per cycle and the output characteristic values are properly sent to the data storage unit 40 and the display/output unit 50. A program (not illustrated) using a database can be used for data storage and display.

EXAMPLE

As an Example, the following conditions are assumed herein.

| | |
|---|---|
| one cycle | 6 seconds |
| processing content | thin film formation by sputtering |
| processing time | one second |
| processing unit | sputtering power supply (output: voltage, current, power) |
| sensor | pressure gauge |
| sampling interval | 40 points/sec |
| acquisition data | discharge power during sputtering |
| characteristic values | ON time, average value, maximum value, minimum value, standard deviation |
| threshold value | 5 W |

Data were processed under the above conditions to obtain characteristic values.

Figure 3:
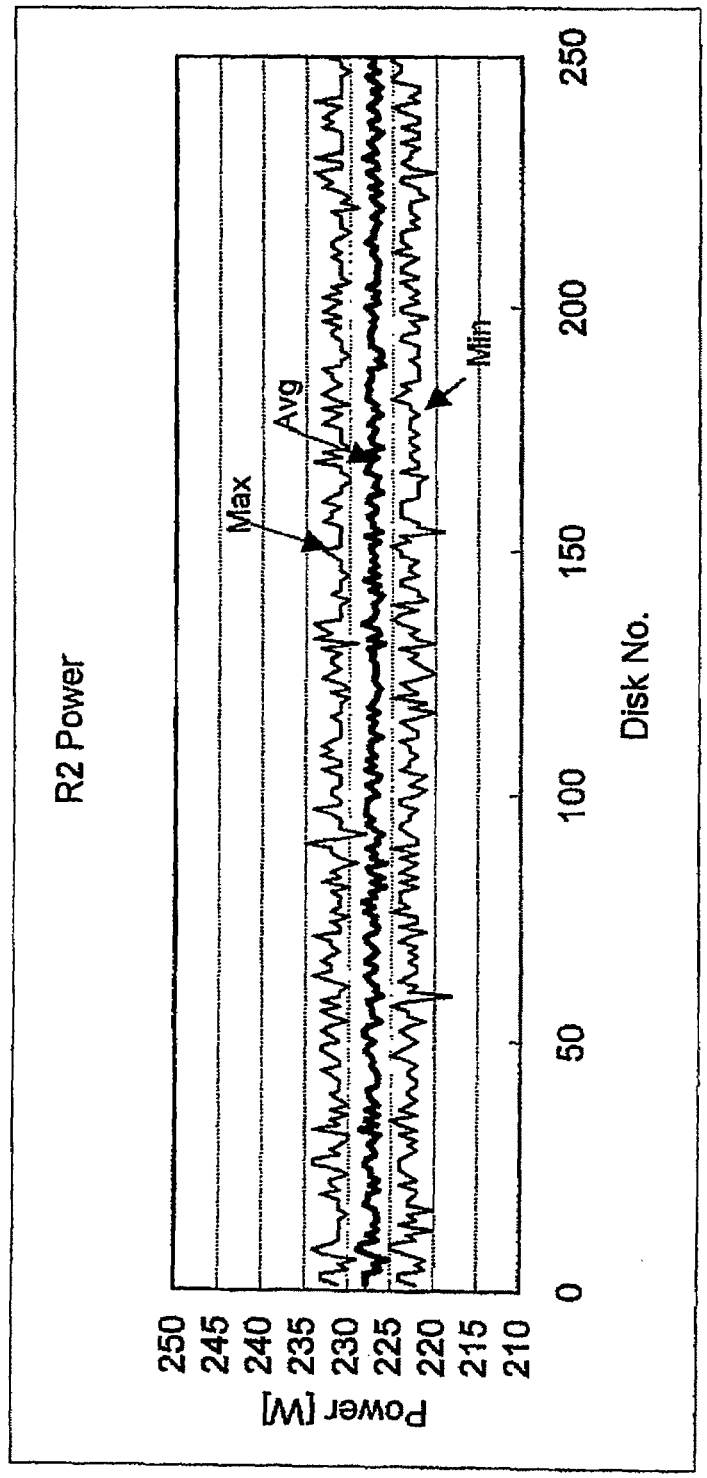
FIG. 3 is a graph in which average values, minimum values, and maximum values of the power being ones of characteristic values are plotted.
Figure 4:
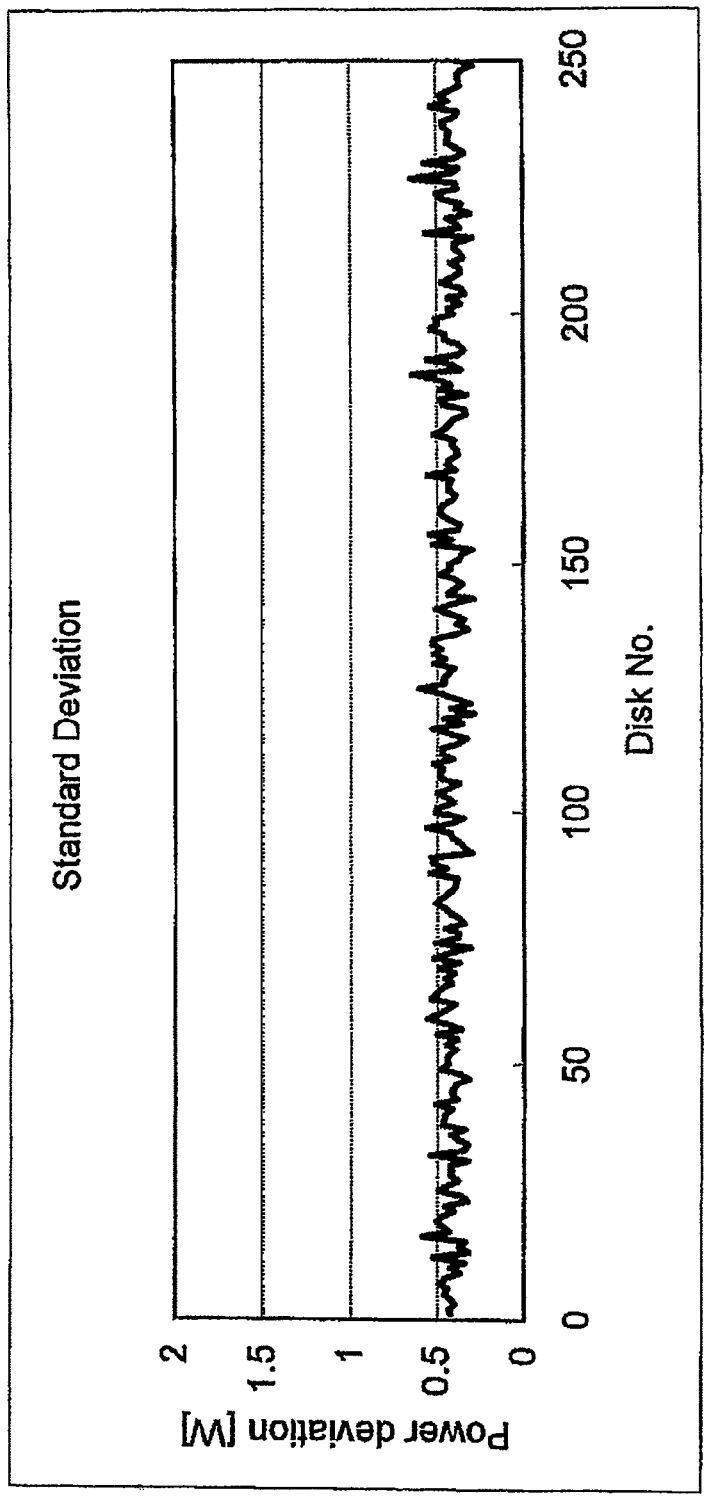
FIG. 4 is a graph in which standard deviations of the power being one of characteristic values are plotted.
Figure 5:
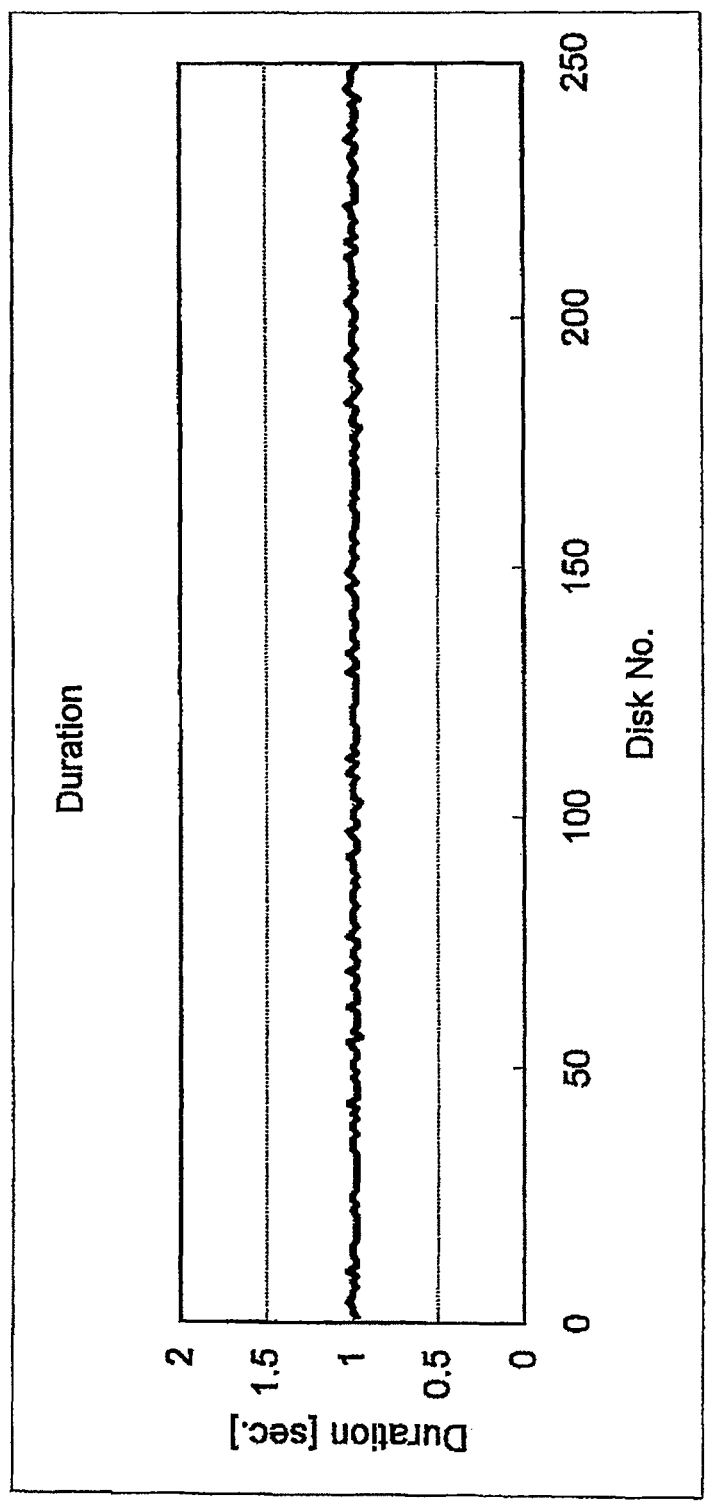
FIG. 5 is a graph in which discharge ON times being one of characteristic values are plotted.

FIGS. 3, 4, and 5 illustrate the results of converting raw data for 250 cycles into the characteristic values in the manufacturing system of FIG. 1. These are waveforms of the characteristic values in the normal state. The axis of abscissas represents disk numbers, wherein one cycle corresponds to one disk.

FIG. 3 is a graph in which average values (middle), maximum values (upper), and minimum values (lower) of the sputtering power (Power) are plotted.

FIG. 4 is a graph in which standard deviations (Standard Deviation) of the power during the power ON are plotted.

FIG. 5 is a graph in which ON times (Duration) of the sputtering power are plotted, wherein a power-ON threshold value was set to 5 W.

Figure 19:
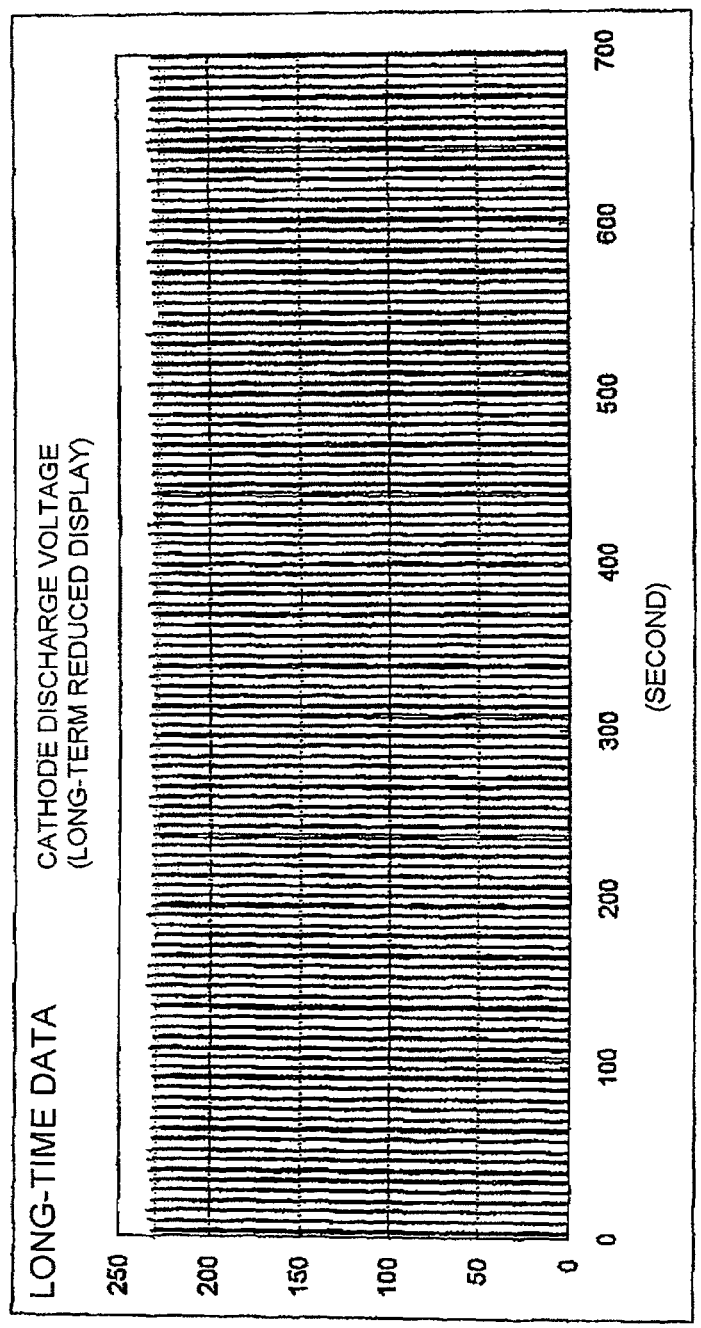
FIG. 19 is a graph in which raw data collected in the same system are plotted over a long period of time.
Figure 20:
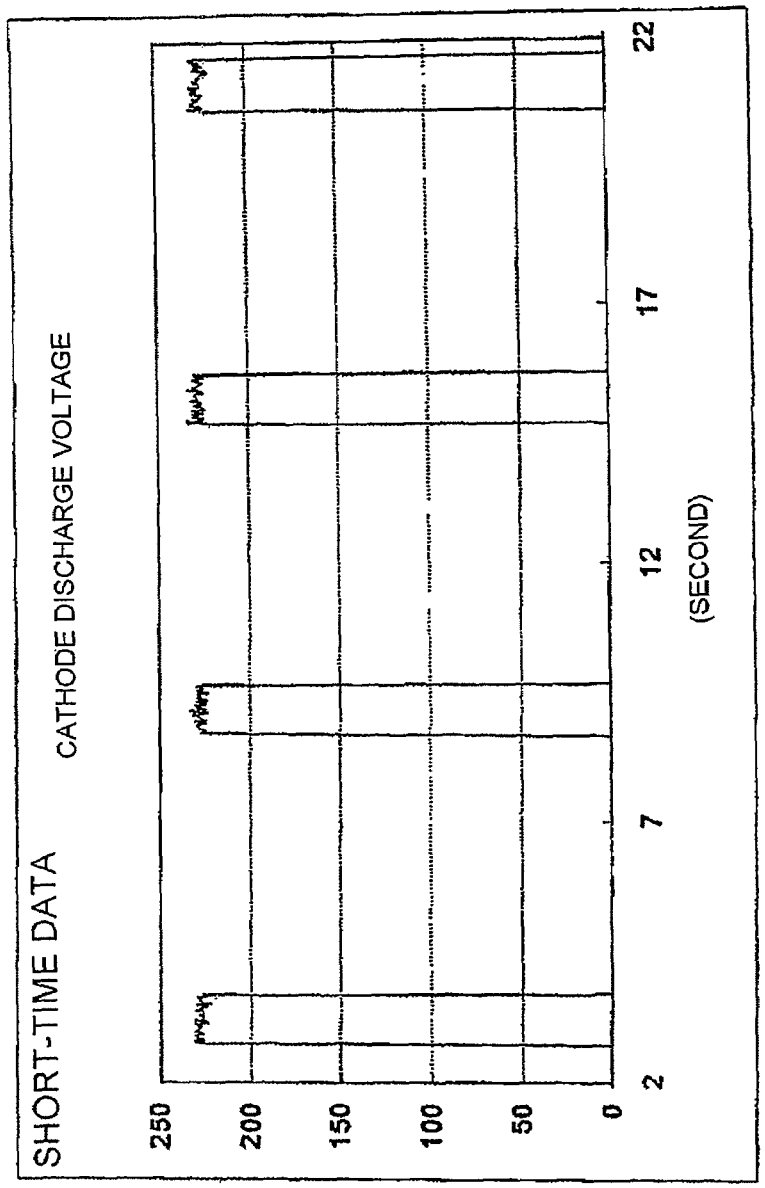
FIG. 20 is a graph in which part of FIG. 19 is enlargedly displayed by magnifying the axis of abscissas.

In the foregoing raw data graph of FIG. 19, raw data for about 130 cycles are displayed, but it is difficult to confirm whether a waveform of each cycle has a problem or not. When enlargedly displayed as in FIG. 20 by scaling up the axis of abscissas for confirming each waveform, it is possible to see the shape of each waveform, but it is difficult to compare the difference with waveforms at remote portions. Further, although the operation of confirming the shape of waveforms by visual observation sometimes makes it easy to find an abnormal point, since it is the operation by a human being, there is also a possibility of making an oversight.

On the other hand, FIGS. 3, 4, and 5 in which the raw data are converted into the characteristic values each display the data for the cycles twice those displayed in FIG. 19. From FIG. 3, it is seen that the average power during discharge is about 227 W and there is a change of about ±2 W between the cycles. Further, it is seen that the maximum value of the power during discharge is 231 W, the minimum value is about 222 W, and there is also a change of about ±2 to 3 W for them.

From FIG. 4, it is seen that the standard deviation of the power during discharge in each cycle is about 0.4 W. Further, from FIG. 5, it is seen that the discharge time is substantially constant at 1.0 second.

From these, it can be confirmed that the discharge time and the discharge power are both substantially constant over 250 cycles with respect to the power. In this manner, by plotting the characteristic values instead of the raw data, it is possible to easily confirm the stability of the repeated cycles.

Figure 6:
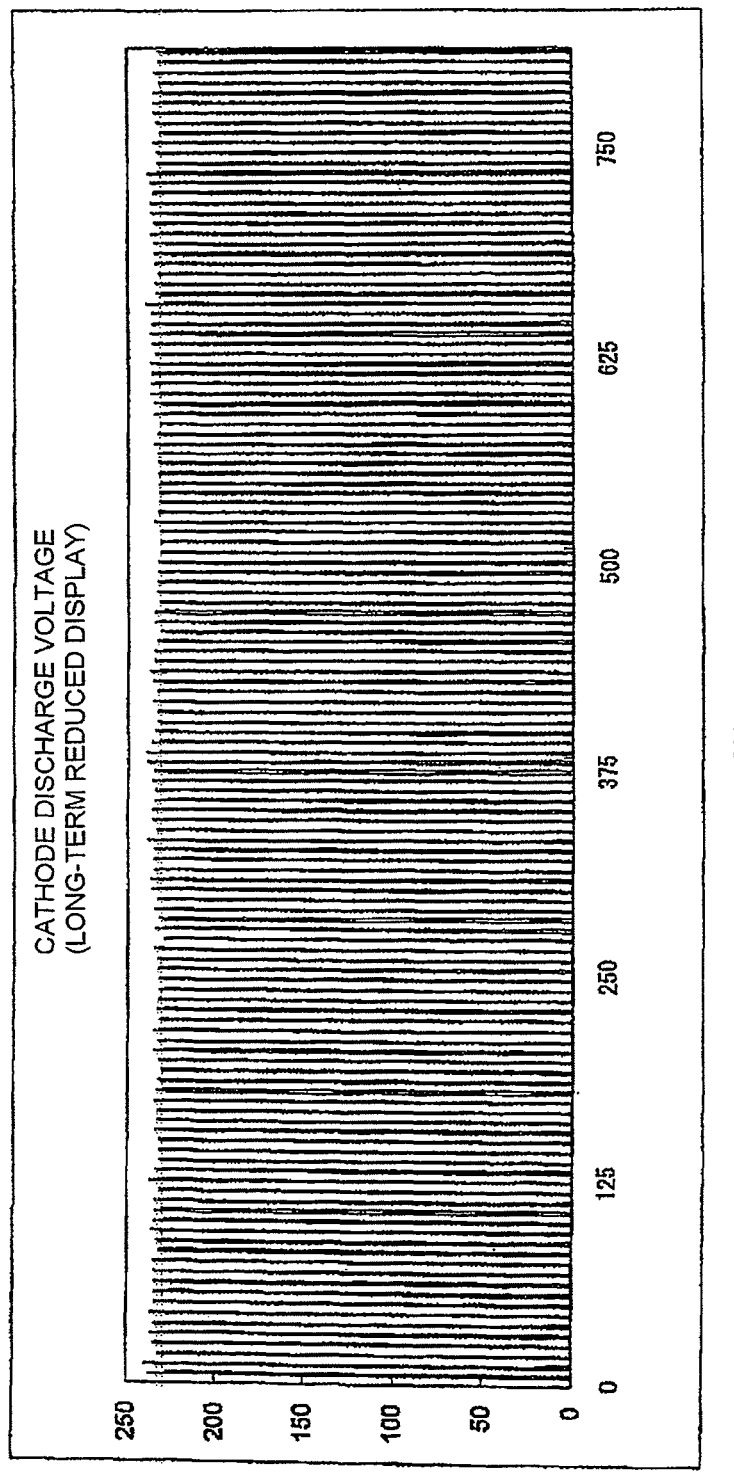
FIG. 6 is a graph in which raw data collected in the same system are plotted over a long period of time.
Figure 7:
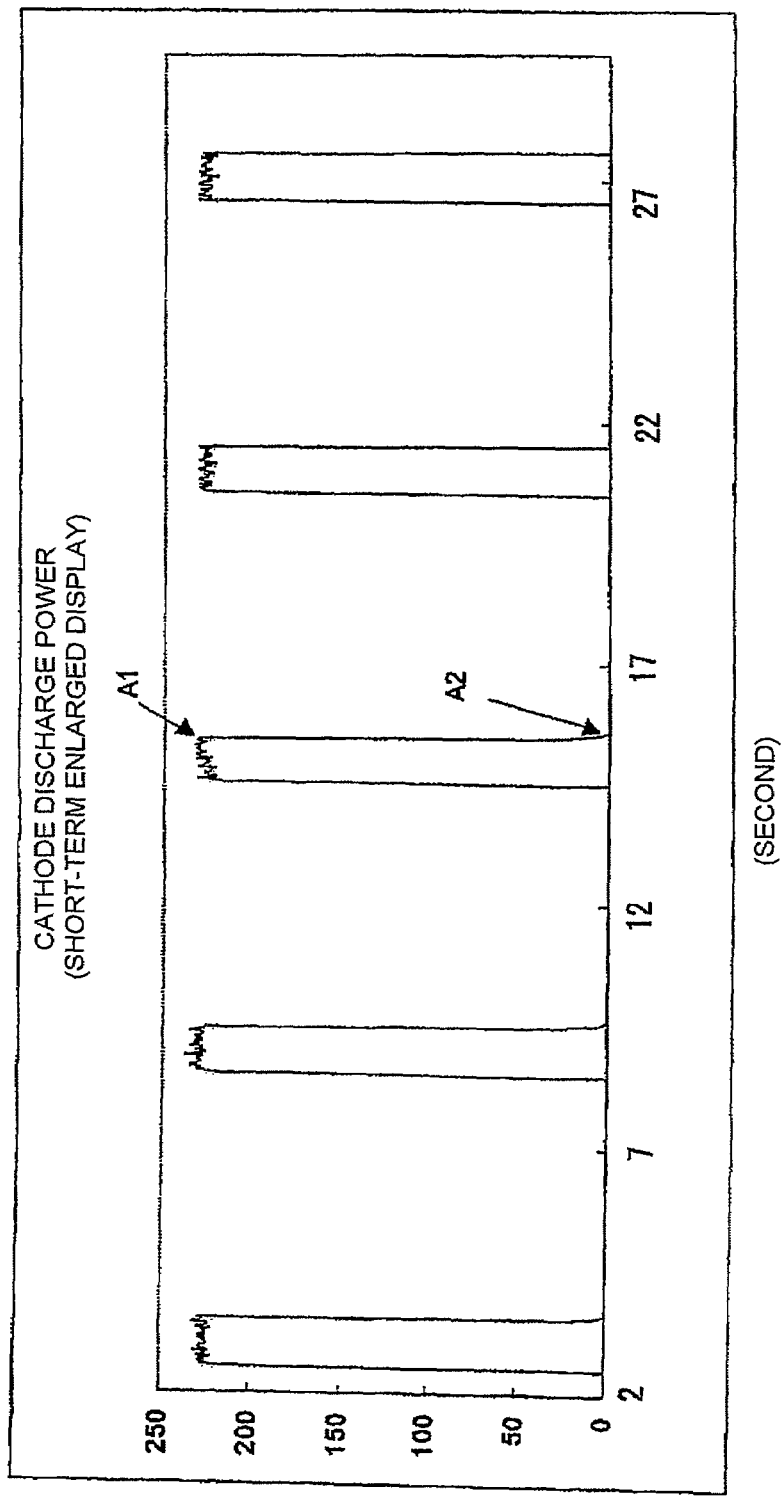
FIG. 7 is a graph in which part of FIG. 6 is enlargedly displayed by magnifying the axis of abscissas.

FIGS. 6 and 7 are diagrams each illustrating, in the form of a graph, raw data collected when a failure is discovered in a processed magnetic disk. In a comparison between FIGS. 19 and 6, the difference is not clear by visual observation. FIG. 7 is obtained by scaling up the axis of abscissas of FIG. 6. By carefully observing FIG. 7 while comparing with FIG. 20, it is seen that a waveform during discharge is slightly unstable (arrow A1) and the trailing edge of the discharge is slightly tailed (arrow A2).

However, such a difference tends to be overlooked by visual confirmation and, in the case of short-time cycles, the visual confirmation itself becomes difficult.

Figure 8:
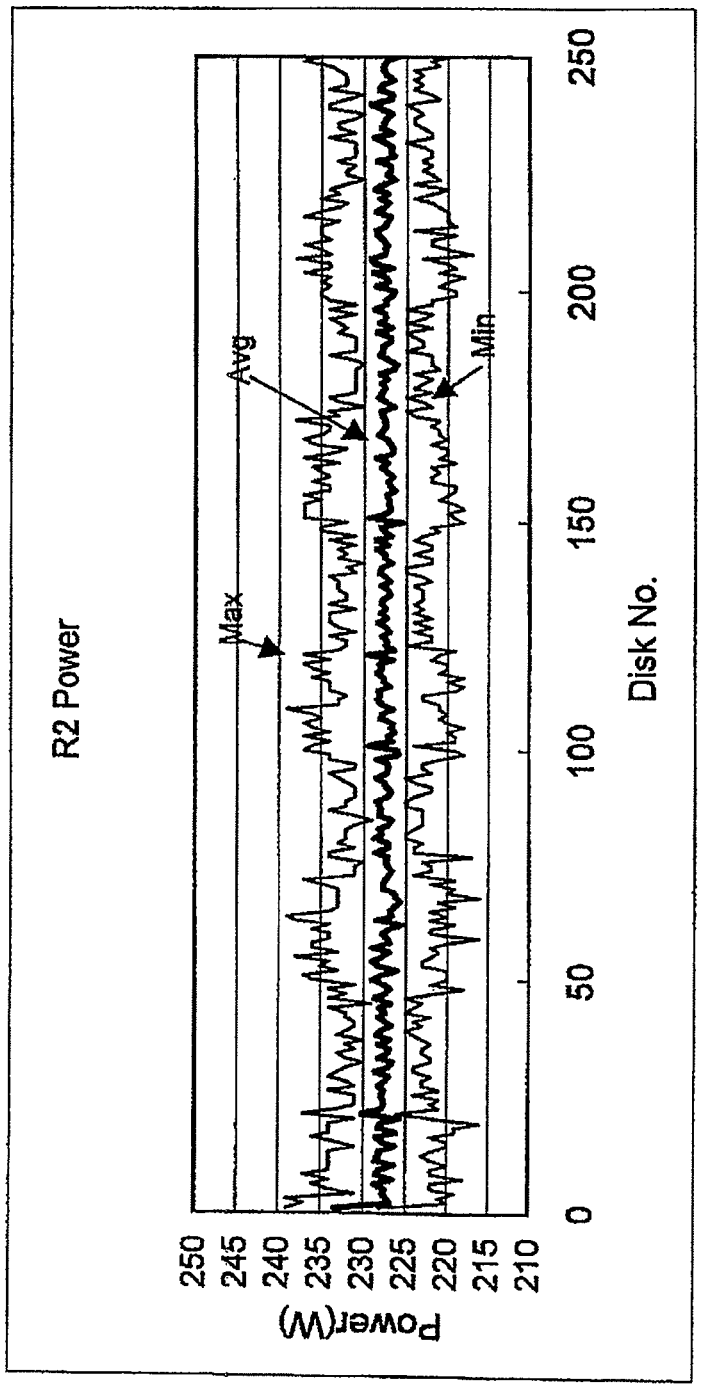
FIG. 8 is a graph in which average values, minimum values, and maximum values of the power being ones of characteristic values, when abnormality is detected, are plotted.
Figure 9:
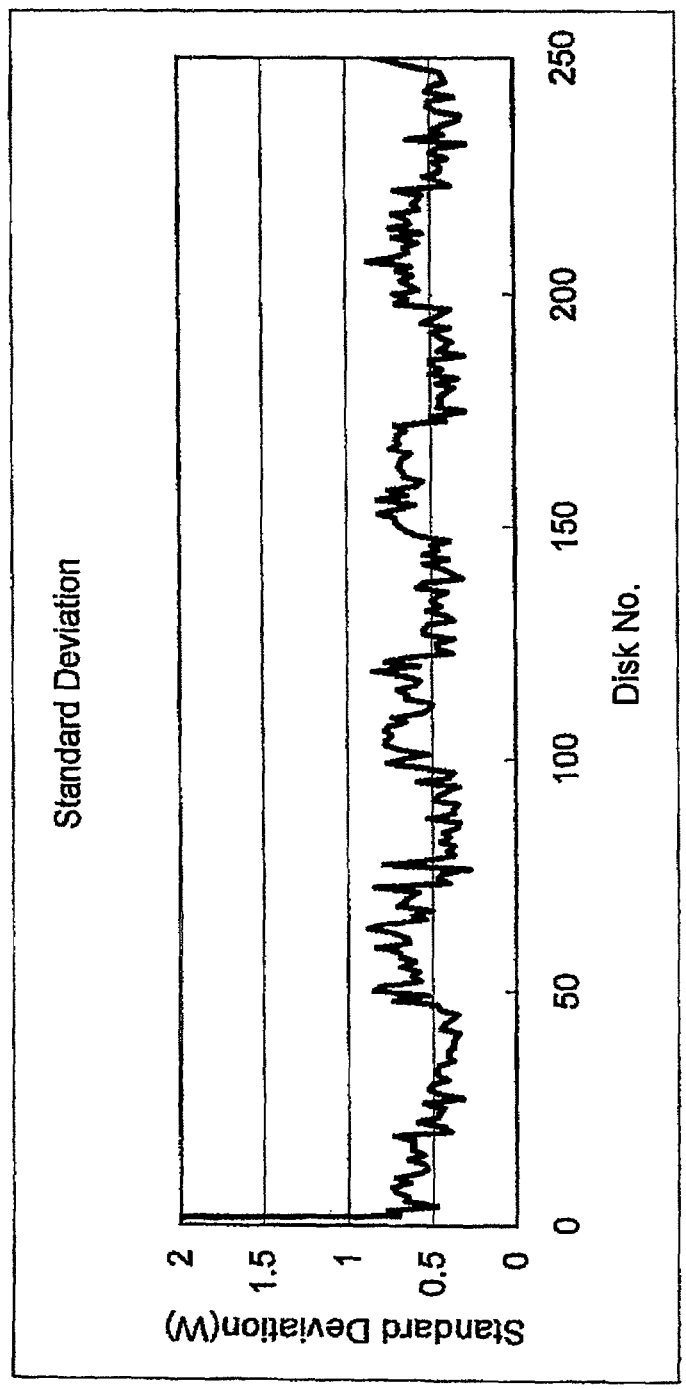
FIG. 9 is a graph in which standard deviations of the power being one of characteristic values, when abnormality is detected, are plotted.
Figure 10:
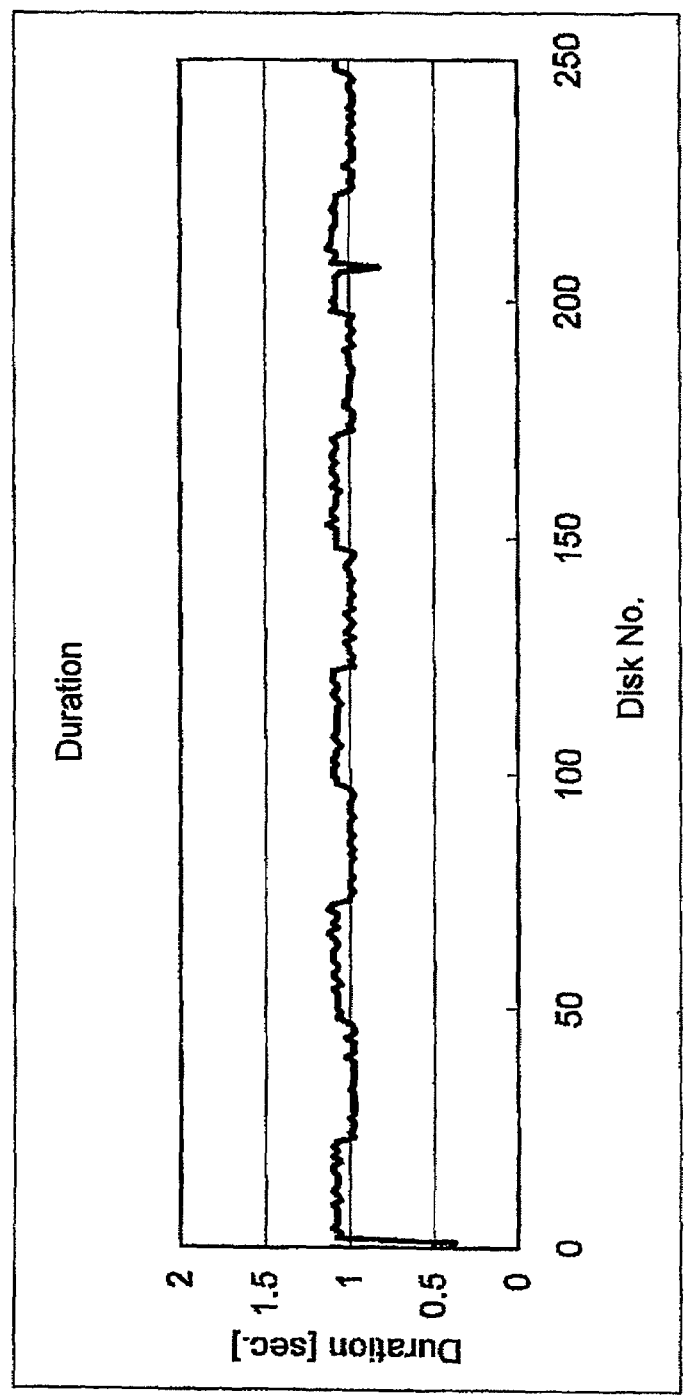
FIG. 10 is a graph in which discharge ON times being one of characteristic values, when abnormality is detected, are plotted.

FIGS. 8, 9, and 10 illustrate the results of converting the raw data of FIGS. 6 and 7 into characteristic values.

FIG. 8 is a graph in which the powers (Power) during discharge are plotted, wherein it is seen that the maximum value and the minimum value change periodically (approximately 50 cycles=50 disks).

FIG. 9 is a graph in which standard deviations (Standard Deviation) of the power during discharge are plotted. It is seen that the standard deviation also changes periodically per 50 disks, wherein the standard deviation increases at 1 to 25 disks and 51 to 75 disks.

FIG. 10 is a graph in which discharge ON times (Duration) are plotted. It is clearly seen that the discharge time changes per 25 disks.

By paying attention to the standard deviation, it is considered that since the standard deviation takes a value equivalent to that (0.4 W) in the normal state at 26 to 50 disks, 76 to 100 disks, . . . , the cycles of 26 to 50 disks, 76 to 100 disks, . . . are normal. On the other hand, it is seen that the standard deviation is 0.6 to 0.8 in the cycles of 1 to 25 disks, . . . and thus the variation in discharge power is large in these cycles.

Therefore, it is possible to judge that the possibility is high that the processing device has a problem during this data acquisition. As a result of actual examination, it was found that another processing unit connected to this device performed a treatment per cycle of 25 disks and noise generated from a cable of a high-frequency power supply used therein affected the sputtering power supply. In this manner, by the conversion into the characteristic values, it is possible to clearly display the abnormality that is difficult to confirm by visual observation.

Next, characteristic value calculation examples will be given.

Various values can be considered as characteristic values. Herein, calculation methods will be described using relatively easy examples. Other than these, as described before, various statistical values of waveform rise time and discharge period of time, and so on can be considered. Further, other than the calculation methods given herein, there are considered to be a number of methods that can obtain the same results and, therefore, the methods are not particularly limited thereto.

<Average Value Avg>

When raw data becomes a threshold value or more, the raw data are successively placed into array variables $C(n)$ and, when the raw data becomes less than the threshold value, the placement is finished. An average value (avg) is calculated from the placed m values.

$$\text{Average Value}=(C(1)+\ldots+C(m))/m$$

<Maximum Value Max>

When raw data becomes a threshold value or more, the raw data are placed into array variables $D(n)$ and, when the raw data becomes less than the threshold value, the placement is stopped. Then, the magnitudes of the array variables are compared and the greatest value is set as a maximum value (max). For acquiring proper data, regions where raw data is not collected need to be provided in a constant period of time before and after the start/end of discharge.

<Minimum Value Min>

When raw data becomes a threshold value or more, the raw data are placed into array variables $D(n)$ and, when the raw data becomes less than the threshold value, the placement is stopped. Then, the magnitudes of the array variables are compared and the smallest value is set as a minimum value (min). For acquiring proper data, regions where raw data is not collected need to be provided in a constant period of time before and after the start/end of discharge.

<Standard Deviation Dev>

When raw data becomes a threshold value or more, the raw data are successively substituted into array variables $F(n)$ and, when the raw data becomes less than the threshold value, the substitution is finished. A standard deviation (dev) is calculated from the substituted m values. (formula omitted)

<ON Time Difference>

An ON time difference between two measurement items is calculated. A time instant when the item 1 exceeds a threshold value is put into a variable G and a time instant when the measurement item 2 exceeds a threshold value is put into H. The ON time difference is calculated by H−G. This is used for measuring a time from the power supply output ON to the start of actual discharge.

Figure 11:
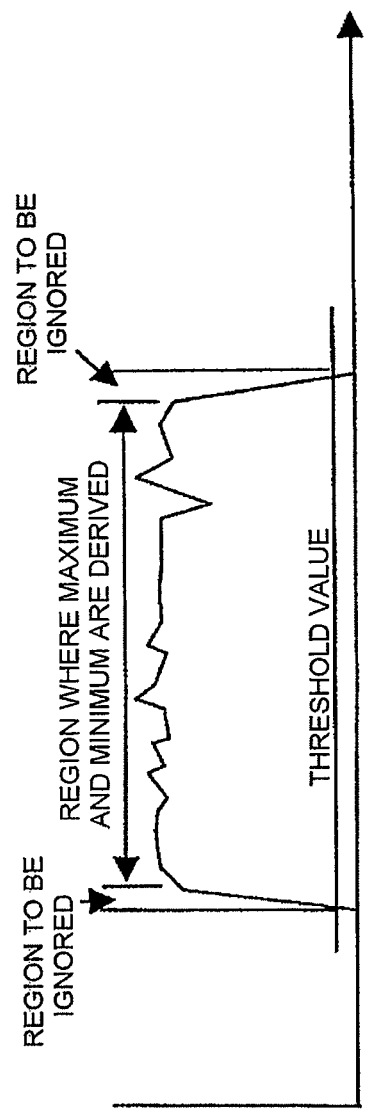
FIG. 11 is a diagram for explaining a region to be ignored when calculating a characteristic value.

Depending on a characteristic value, there is a case where if values immediately after the discharge or immediately before the end thereof are collected, an appropriate value is not output (example: maximum value, maximum value). Therefore, for preventing the collection thereof, regions where data is not collected (regions to be ignored) may be preferably set as illustrated in FIG. 11.

<Discharge ON Time (+Number of Times of Arc Generation)>

A time instant when raw data becomes a threshold value or more is recorded into a variable A as a discharge start time instant and a time instant when the raw data becomes less than the threshold value is recorded into a variable B as a discharge end time instant. A discharge time is calculated by the following calculation formula. Discharge Time=B−A.

In the above method, when an arc is generated so that the discharge voltage becomes zero, the measurement is finished at that time instant. Thereafter, when the arc disappears and the discharge starts again, data start to be collected again. Therefore, as it is, a time from final arc generation to the discharge end is derived.

For preventing this, it is effective to perform an AND operation with a power supply output ON command and to set A and B into an array.

Figure 12:
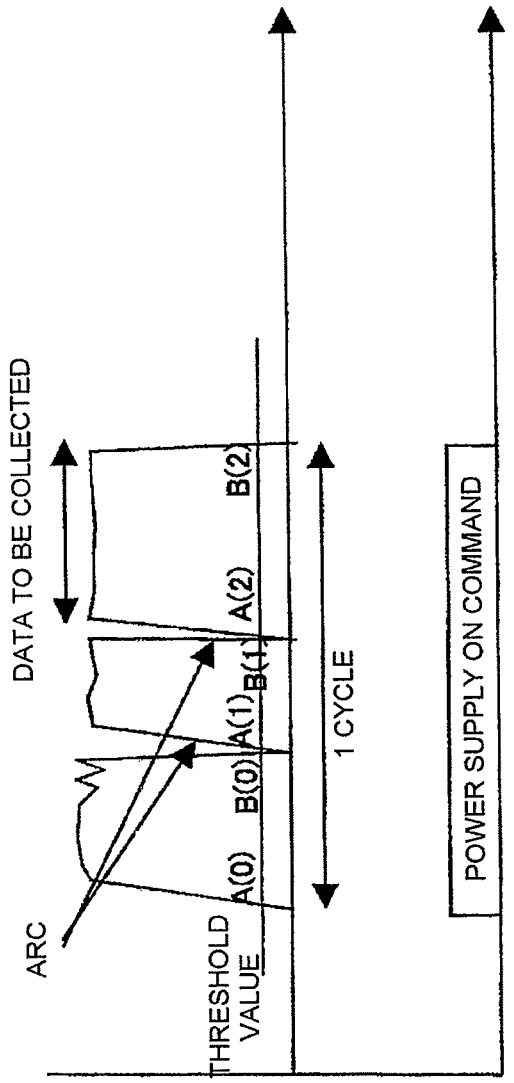
FIG. 12 is a diagram for explaining calculation of a characteristic value when discharge is interrupted.

For example, as illustrated in FIG. 12, while a power supply ON command is output, a discharge start time instant is substituted into $A(0)$ when a threshold value is first exceeded and, then, an arc generation time instant is substituted into $B(0)$ when an arc is generated so that the output becomes less than the threshold value.

When the output is started again after restoration from the arc, an arc restoration time instant is substituted into $A(2)$ and, thereafter, an arc time instant and a restoration time instant are substituted into $A(k)$ and $B(k)$ per occurrence of an arc and k is incremented each time. Then, when the power supply ON signal is stopped and the output becomes less than the threshold value, the above operation is finished.

By performing the above processing, it is possible to calculate a discharge time in consideration of the arc and, further, it is possible to derive the number of times of the arc. However, in terms of judging the discharge with arc generation to be abnormal, it may be better not to incorporate such processing.

$$\text{Actual Discharge Time}=B(0)-A(0)-B(1)-A(1)+\ldots+B(k)-A(k)$$

Number of Times of Arc Generation=k

In each of the methods described above, use is made, as a trigger for calculation of one characteristic value (e.g. power), of a threshold value of the original raw data (power raw data). However, another raw data (e.g. voltage) may be used as a trigger. For example, the voltage is used as a calculation trigger for the power, and so on.

As described above, by storing, instead of raw data, characteristic values (summary data) in the data storage unit 40, the data storage amount can be reduced and therefore it is advantageous when collecting data over a long period of time or measuring a large number of items.

In the above Example, sampling is performed at 40 points per second and, therefore, when storing raw data, the data amount becomes 144000 data per hour. In the magnetic disk manufacturing sputtering process or the like, a plurality of processing devices are connected together and, further, there are several tens of measurement items in each processing chamber, and therefore, the number of total measurement items often exceeds 100.

For example, when data on 100 items are sampled at 40 points per second, the data amount becomes 691 MB per day, 20 GB per month, and 252 GB per year in the case of the storage of raw data. In contrast, in the case of the storage of characteristic values, even the data for one year are reduced to 52 MB and thus the handling of data becomes extremely easy as compared with the raw data.

The data amounts are compared. The conditions are as follows.

| | |
|---|---|
| number of times of sampling | 40 points/sec |
| cycle time | 6 seconds |
| measurement item | 100 items |
| data byte | 2 byte/data |
| number of characteristic values | 5 items |

<Comparison Table>

| | (In Case of Raw Data) | (In Case of Characteristic Values) |
|---|---|---|
| number of data per cycle | 240/cycle | 5/cycle |
| number of cycles per hour per point per hour | 600 cycles 144000 | 600 cycles 600 |
| number of data per hour | 14400000 | 3000 |
| number of bytes per hour | 28.8 MB | 6 KB |
| number of bytes per day | 691.2 MB | 144 KB |
| number of bytes per 30 days | 20.7 GB | 4.3 MB |
| number of bytes per year | 252.3 GB | 52.6 MB |

Next, a description will be given of a way of using (extendability of) the foregoing embodiment.

As described above, by converting raw data into characteristic values, it is possible to easily perform abnormality detection that conventionally relied on visual observation. For example, it is very difficult to confirm a discharge time using raw data, but it can be easily confirmed using a characteristic value called a discharge ON time.

In addition to the foregoing configuration, there may be preferably provided reference value setting means for setting an upper or lower limit reference value with respect to each of characteristic values (summary data), abnormality judging means for judging abnormality based on comparison between the reference values and the characteristic values, and alarm generating means for generating an alarm according to a result of the judgment by the abnormality judging means. For example, if upper/lower limit alarms are set with respect these characteristic values, abnormality can be effectively discovered. Also with respect to variation during discharge, if upper/lower limit alarms are set for the characteristic values such as the standard deviation, the maximum value, and the minimum value, it is possible to use them for an acceptance/rejection judgment or the like. Even with respect to a somewhat complicated waveform, if the characteristics of the waveform can be well converted into numerical values, it is possible to set an upper/lower limit alarm and thus to perform abnormality detection that cannot be realized with an upper/lower limit alarm of raw data. In this manner, if the characteristic value is used, the upper/lower alarm can be effectively utilized, which is beneficial. In this case, structurally, there may be preferably provided means for judging whether or not a characteristic value (summary data) output from the calculation section 100 falls within a proper range and means for generating an alarm when the characteristic value is judged to deviate from the proper range. By adding all or part of the above configuration to the basic configuration, it is possible to effectively notify and discover abnormality.

Further, as another example, the data management using the characteristic values can be associated with the raw data.

Figure 13:
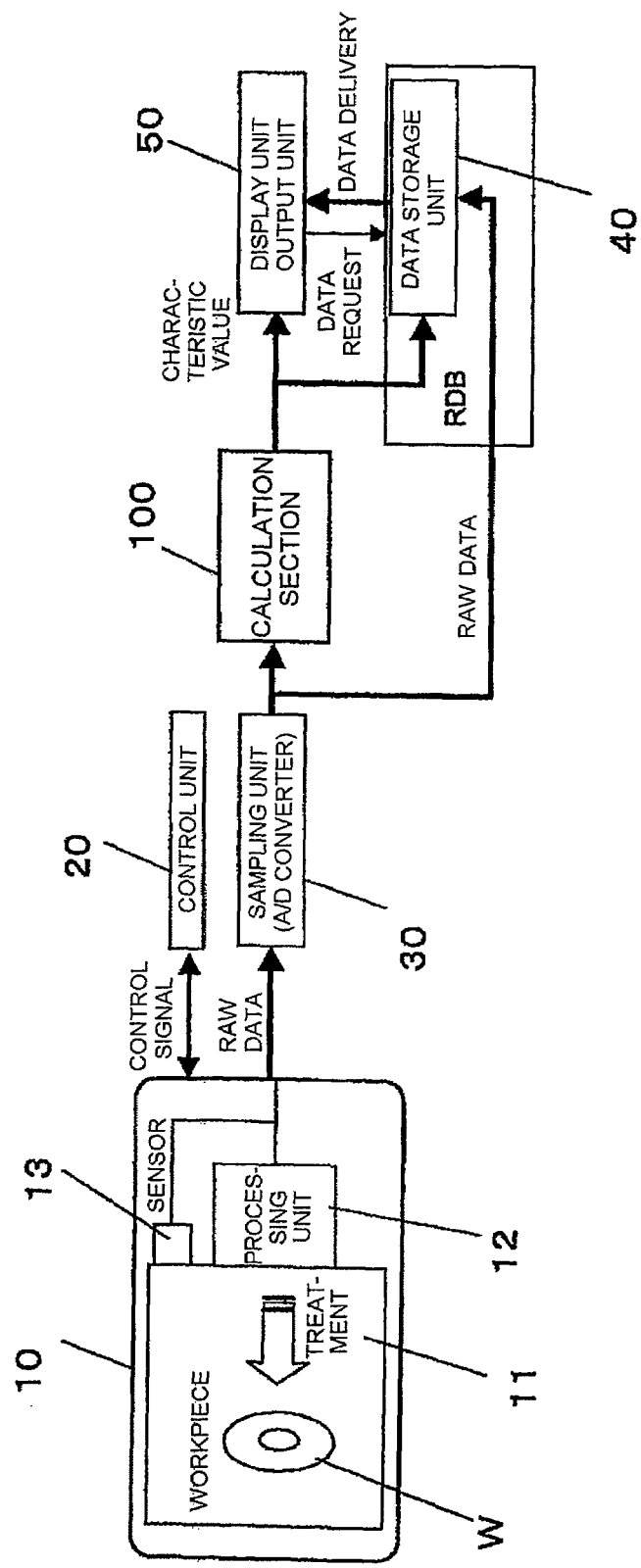
FIG. 13 is a block diagram exemplarily illustrating the configuration of another embodiment of this invention.

FIG. 13 illustrates the configuration provided with a normal raw data storage path in addition to the configuration of FIG. 1. In this case, it is preferable to perform mapping between characteristic value data and raw data using a relational database (RDB). With this, it is possible to produce a program that makes it possible to refer to raw waveforms if necessary when abnormality is discovered. In this case, it is necessary to provide a large-capacity disk storage unit for the storage of raw data. However, if it is set to automatically delete those data after the lapse of a fixed period of time in the database, it is possible to prevent an excessive increase in data volume. Further, by setting an upper/lower limit value, it is possible to automatically start raw data storage only when data deviates from a set range.

Next, a description will be given of a case where it is extended as a production management system.

If the foregoing alarm information is input and stored in a database along with the characteristic values, it is possible to easily examine the behavior of the characteristic values at the time of the generation of the alarm. As a production management system in that case, it is preferable to have the following functions.

(a) When the date and a disk number are input, a table of characteristic values of a disk concerned is displayed.

(b) When there is an alarm, the alarm contents are also displayed.

(c) When the date and a cassette number are input, a table of characteristic values of all disks of a cassette concerned is displayed. Further, the alarm contents are also displayed.

(d) When a period of time and a chamber number are input, a trend graph of characteristic values of a chamber concerned is displayed. Further, an alarm generated place is marked and the alarm contents are displayed.

(e) When a period of time and a chamber number are input, characteristic values of a chamber concerned are output in the form of an Excel file or a CVS file. Further, alarm generation data is also output.

(f) A recipe change history and actual values are displayed in a graph and a portion with a deviation of a certain value or more is highlighted.

These functions can all be realized by jointly using a database.

When the production management system having the above functions is constituted, it is possible to achieve an improvement in quality management and a quick response by free information exchange between a product user and a product manufacturer through communication means such as the Internet.

Next, the data processing flow up to calculation of characteristic values will be described with reference to a flowchart.

Figure 14:
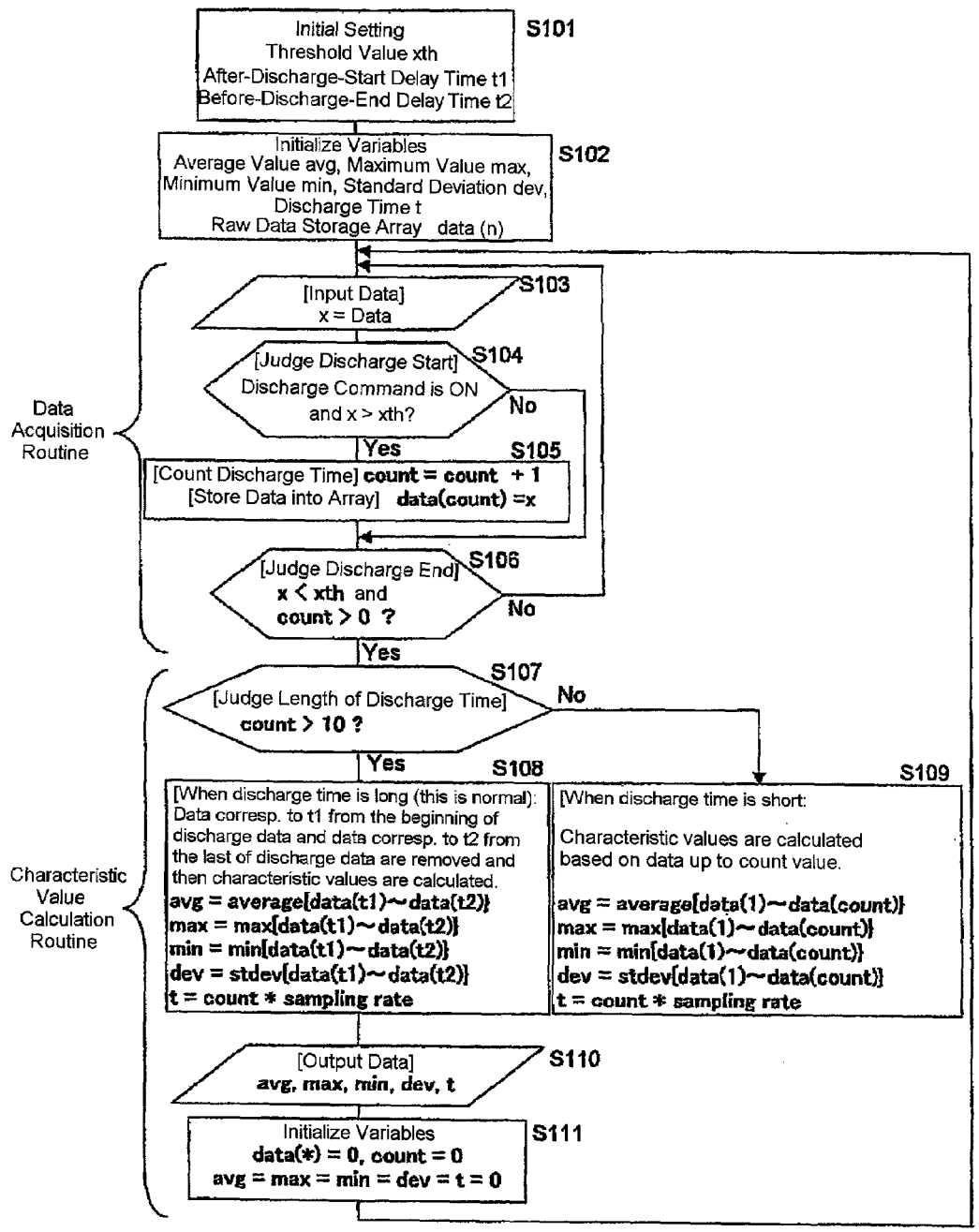
FIG. 14 is a flowchart illustrating a first example of the processing flow when calculating characteristic values.

FIG. 14 is a flowchart illustrating a first data processing example performed in the calculation section 100.

In this processing example, a method is employed that successively stores data in a discharge period of time into array variables. Therefore, it is necessary to ensure a large memory area. This method can be easily realized by the software on a personal computer, but has difficulty in applying to a device with a small capacity memory, such as a PLC (Programmable Logic Controller, i.e. a sequencer). A second data processing example using no array variables is suitable for PLC.

When the processing of the flowchart of FIG. 14 is started, initial setting of a threshold value xth, an after-discharge-start delay time t1, and a before-discharge-end delay time t2 (times corresponding to the regions to be ignored in FIG. 15) is performed in step S101. Then, in step S102, variables such as an average value avg, a maximum value max, a minimum value min, a standard deviation dev, and a raw data storage array data(n) are initialized.

Then, in step S103, raw data is input (x=data). Then, in step S104, the discharge start is judged. The discharge start is judged based on whether or not a discharge command is ON and x>xth. If it is judged that the discharge starts (Yes), step S105 starts counting a discharge time (count=count+1) and stores the data into an array (data(count)=x). Then, in step S106, the discharge end is judged. The discharge end is judged based on whether or not x<xth and count>0. While the end conditions are not satisfied, the loop of steps S103 to S106 is repeated. Each time the loop is repeated, a value of raw data x is stored into an array variable data( ). When the discharge ends (when x<xth and count>0), the processing goes out of the loop and enters a characteristic value calculation routine.

In step S107 of the characteristic value calculation routine, the length of the discharge time is judged (count>10) and, when the discharge time is long, the processing proceeds to step S108 where data corresponding to t1 from the beginning of the discharge data and data corresponding to t2 from the last of the discharge data are removed and then the characteristic values (average value avg, maximum value max, minimum value min, standard deviation dev, and discharge time t) are calculated.

$$avg=average\{data(t1)\sim data(t2)\}$$

$$max=max\{data(t1)\sim data(t2)\}$$

$$min=min\{data(t1)\sim data(t2)\}$$

$$dev=stdev\{data(t1)\sim data(t2)\}$$

$$t=count*sampling\ rate$$

On the other hand, when the discharge time is short, the processing proceeds to step S109 where the characteristic values are calculated based on the data up to the count value.

$$avg=average\{data(t1)\sim data(count)\}$$

$$max=max\{data(t1)\sim data(count)\}$$

$$min=min\{data(t1)\sim data(count)\}$$

$$dev=stdev\{data(t1)\sim data(count)\}$$

$$t=count*sampling\ rate$$

Then, in either case, in step S110, the calculated characteristic value data (avg, max, min, dev, t) are output and, in step S111, the variables are initialized. Then, the processing returns to step S103.

$$data(*)=0, count=0$$

$$avg=max=min=dev=t=0$$

Figure 15:
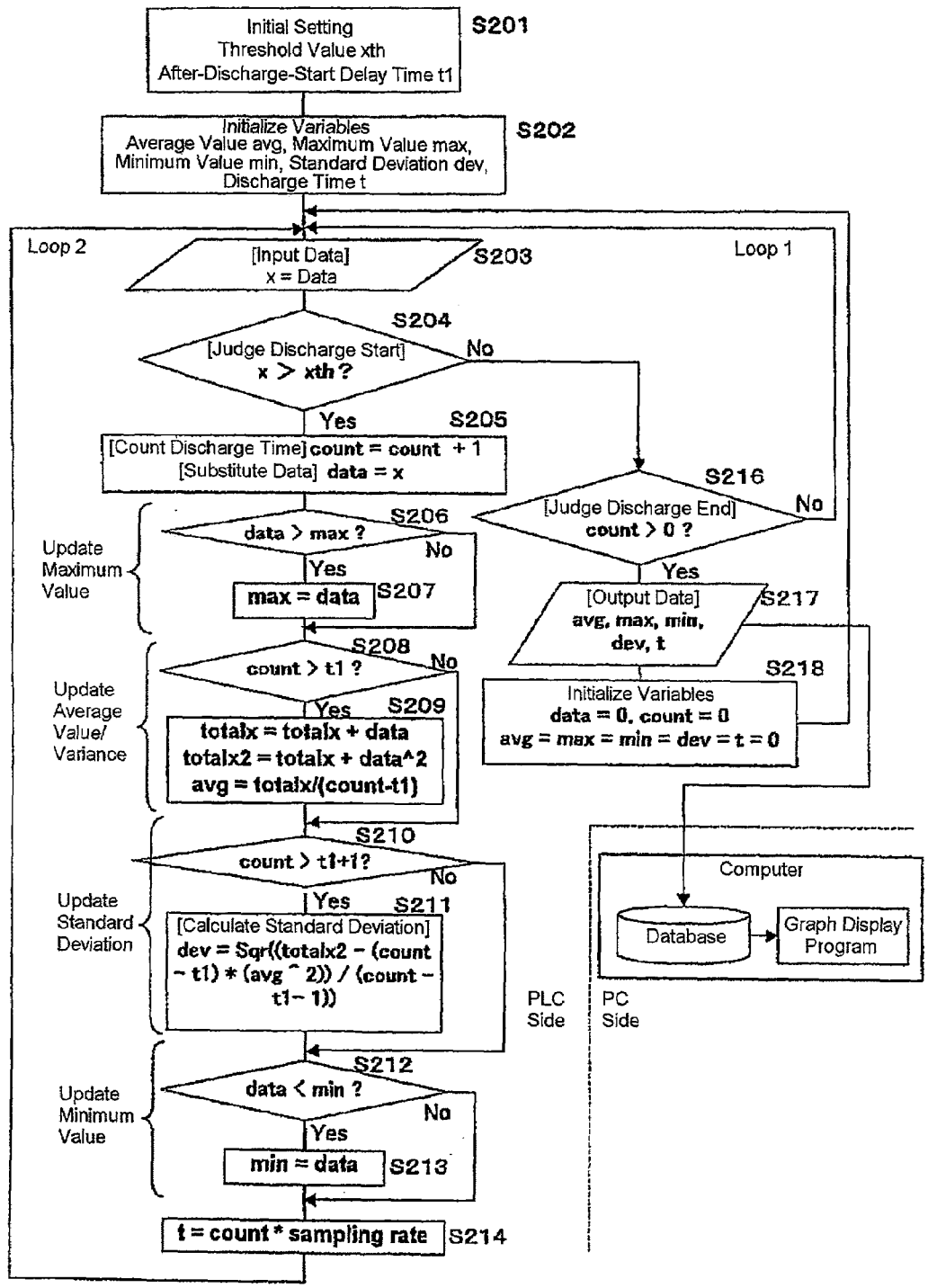
FIG. 15 is a flowchart illustrating a second example of the processing flow when calculating characteristic values.

FIG. 15 is a flowchart illustrating a second data processing example performed in the calculation section 100.

This flowchart shows the processing example using no array variables. Steps S201, S202, and S203 are the same as steps S101, S102, and S103 in the flowchart of FIG. 14. Step S204 performs a discharge judgment based on x>xth and, when input raw data x is less than the threshold value xth, the processing proceeds to step S216 and repeats a loop 1 that goes through steps S203, S204, and S206 in order.

When the data x exceeds xth, the judgment in step S204 becomes YES so that the processing enters a loop 2 to calculate respective characteristic values in sequence.

That is, step S205 counts up a discharge time (count=count+1) and substitutes the data (data=x) and steps S206 and S207 update the maximum value (when data>max, max=data is set). Further, next steps S208 and S209 update the average value/variance (when count>t1, totalx=totalx+data, totalx2=totalx+data^2, and avg=totalx/(count−t1) are set).

Further, steps S210 and S211 perform calculation of the standard deviation (when count>t1+1, dev=Sqr((totalx2−(count−t1)*(avg^2))/(count−t1−1)) is calculated). Further, steps S212 and S213 update the minimum value (when data<min, min=data is set). Then, step S214 calculates the discharge time (t=count*sampling rate).

When the discharge ends, the processing again enters the loop 1, outputs the results (step S217), initializes the variables (step S218), and repeats the loop 1 until the next discharge occurs. The discharge end is judged to be positive when data x<threshold value xth and count>0 are both satisfied and, when these conditions are satisfied (i.e. immediately after the discharge end), the data are once output to a database.

Figure 16:
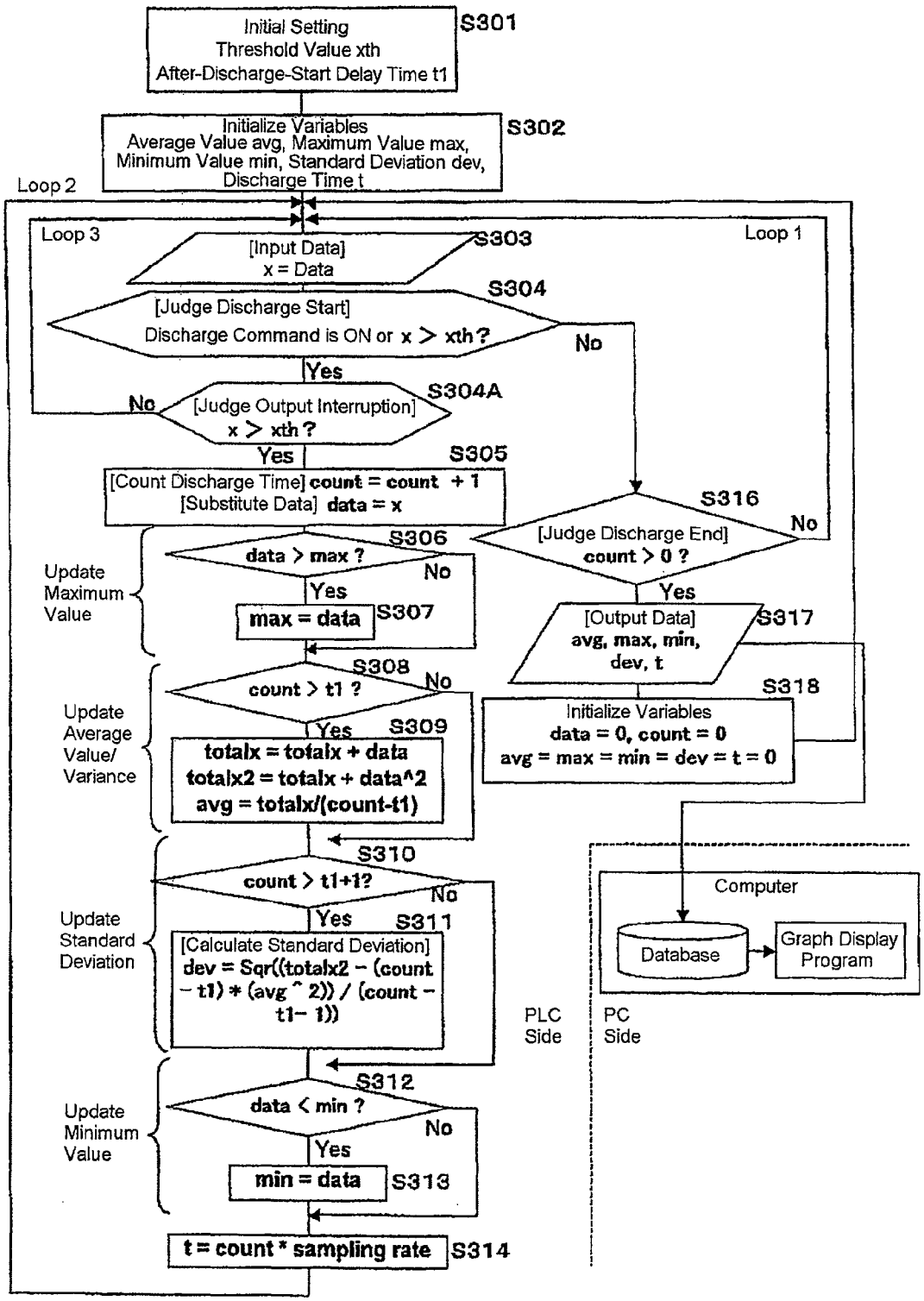
FIG. 16 is a flowchart illustrating a third example of the processing flow when calculating characteristic values.
Figure 17:
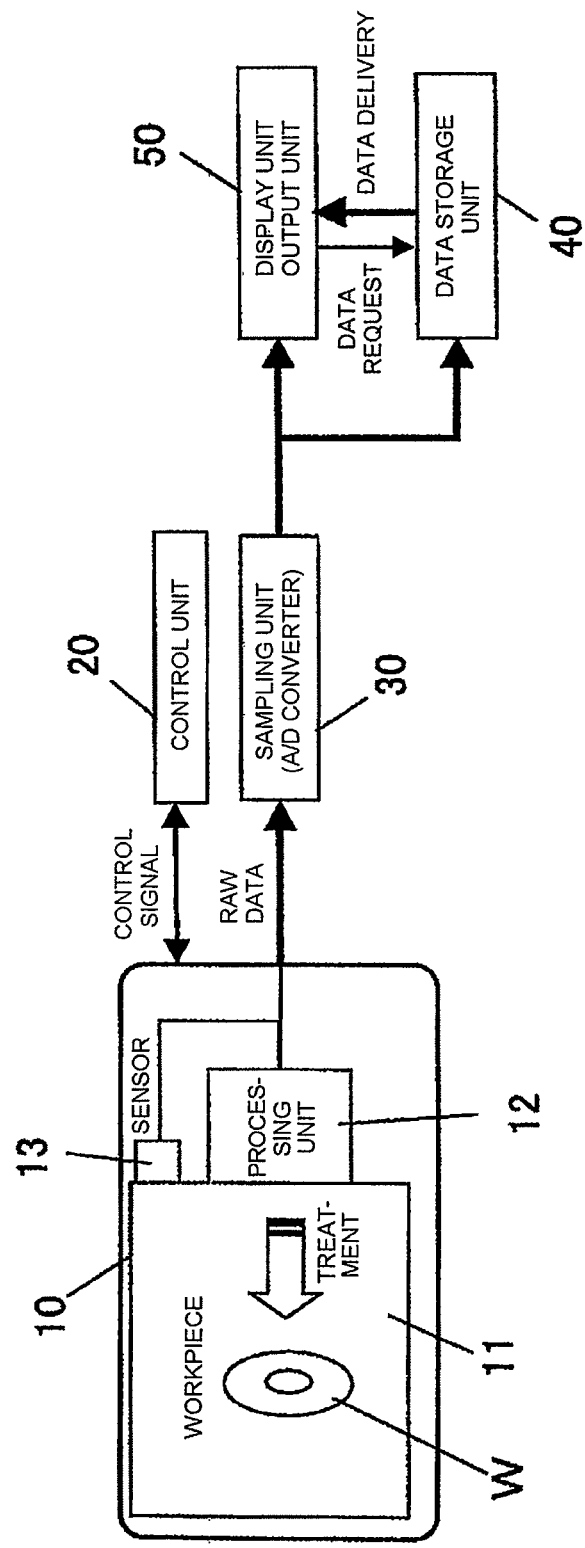
FIG. 17 is a block diagram exemplarily illustrating the configuration of a conventional magnetic disk manufacturing system.
Figure 18:
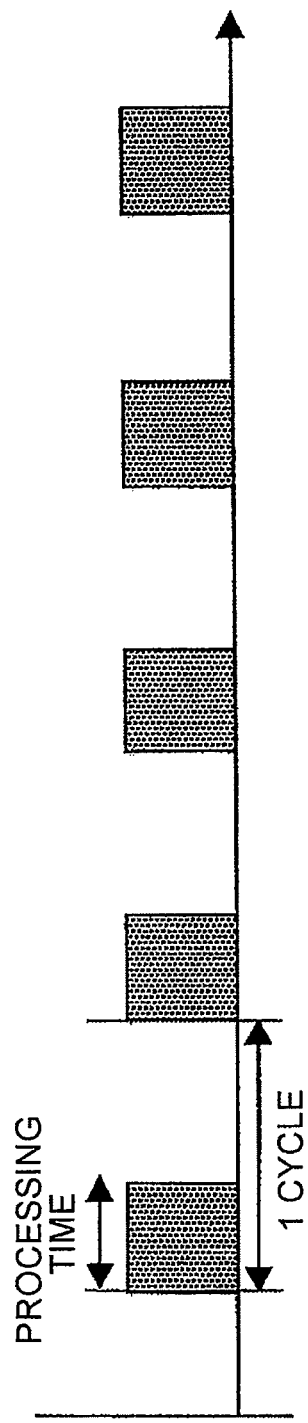
FIG. 18 is a diagram for explaining the concept of one cycle of the same system.

FIG. 16 is a flowchart illustrating a third data processing example performed in the calculation section 100.

This flowchart shows the processing example corresponding to a case where the discharge is temporarily interrupted due to arc or the like, which is obtained by partly changing the second data processing example of FIG. 15. Among steps S301 to S318, only steps S314A and S314B differ from the example of FIG. 15 and the others are the same as steps S201 to S218 of FIG. 15, and therefore, only the different point will be described.

In this example, a discharge ON command from a PLC is input and conditions are branched. Discharge interruption is judged to be positive based on the condition that the discharge command is ON and data is less than a threshold value in steps S304A and S304B. In this case, the processing enters a loop 3 and does not count a discharge time or perform sequential calculation of data. When the discharge starts again, the judgment in step S304B becomes YES so that the processing enters a loop 2 to normally perform counting of the discharge time and sequential calculation of data.

Through the calculation processing performed in the calculation section 100 as described above, the proper characteristic values are calculated.

The data processing illustrated in each of FIGS. 14 to 16 is performed according to a program recorded in a computer-readable recording medium. Therefore, this invention also covers programs adapted to execute the processing of FIGS. 14 to 16 and recording media recording those programs.

INDUSTRIAL APPLICABILITY

In the foregoing embodiments, the description has been given of the case where this invention is applied to the magnetic disk manufacturing systems. However, this invention is also applicable to other processing devices for processing substrates, for example, a semiconductor manufacturing system and so on. Further, this invention is applicable not only to a processing device for processing workpieces by sputtering, but also to a system that performs other processing such as CVD.

The invention claimed is:

1. A processing data managing system comprising:
a data processing section for receiving raw data on processing conditions of film forming treatments for magnetic disks collected in a magnetic disk manufacturing apparatus that performs a same process treatment for each of repeated cycles and processing said raw data into a characteristic value for each of the repeated cycles, and
a data storage unit for storing the characteristic value for each of the repeated cycles in a storage,
said data processing section obtaining the characteristic value for each of the repeated cycles by converting the raw data for one cycle into the characteristic value representing characteristics of the raw data for one cycle,
said data storage unit storing the characteristic values for the repeated cycles in the storage so as to visualize time-dependent changes of the characteristic values for the repeated cycles,
the magnetic disk manufacturing apparatus being configured to form magnetic disk thin films on the surface of a substrate by generation of discharge in a processing chamber maintained in a predetermined gas pressure atmosphere;
the raw data being such that the number of data per hour is 14400000 or more where at least the raw data on power supply output for generation of the discharge are collected at regular sampling intervals, one cycle is set to 6 seconds, and sampling is performed 40 times in each second;
the characteristic value being repeatedly calculated for each cycle, based on the raw data on the power supply output, on five items including a discharge ON time and an average value, a maximum value, a minimum value, and a standard deviation of the power supply output so that one cycle is represented by plot data at one point.

2. A processing data managing system comprising:
a data processing section for receiving raw data on processing conditions of film forming treatments for magnetic disks collected in a magnetic disk manufacturing apparatus that performs a same process treatment for each of repeated cycles and processing aid raw data into a characteristic value for each of the repeated cycles, and
a display unit for chart-displaying the characteristic value for each of the repeated cycles,
said data processing section obtaining the characteristic value for each cycle by converting the raw data for one cycle into the characteristic value representing characteristics of the raw data for one cycle,
said display unit chart-displaying the characteristic values for the repeated cycles so as to visualize time-dependent changes of the characteristic values for the repeated cycles,
the magnetic disk manufacturing apparatus being configured to form magnetic disk thin films on the surface of a substrate by generation of discharge in a processing chamber maintained in a predetermined gas pressure atmosphere;
the raw data being such that the number of data per hour is 14400000 or more where at least the raw data on power supply output for generation of the discharge are collected at regular sampling intervals, one cycle is set to 6 seconds, and sampling is performed 40 times in each second:
the characteristic value being repeatedly calculated for each cycle, based on the raw data on the power supply output, on five items including a discharge ON time and an average value, a maximum value, a minimum value, and a standard deviation of the power supply output so that one cycle is represented by plot data at one point.

3. A processing data managing system comprising:
a data processing section for receiving raw data on a processing conditions of film forming treatments for magnetic disks collected in a magnetic disk manufacturing apparatus that performs a same process treatment for each of repeated cycles and processing said raw data into a characteristic value for each of the repeated cycles,
a data storage unit for storing the characteristic value for each of the repeated cycles in a storage, and
a display unit for chart-displaying the characteristic value for each of the repeated cycles output from said data processing section or the characteristic value for each of the repeated cycles stored in said storage,
said data processing section obtaining the characteristic value for each of the repeated cycles by converting the raw data for one cycle into the characteristic value representing characteristics of the raw data for one cycle,
said data storage unit storing the characteristic values for the repeated cycles in the storage so as to visualize time-dependent changes of the characteristic values for the repeated cycles,
said display unit chart-displaying the characteristic values for the repeated cycles so as to visualize time-dependent changes of the characteristic values for the repeated cycles,
the magnetic disk manufacturing apparatus being configured to form magnetic disk thin films on the surface of a substrate by generation of discharge in a processing chamber maintained in a predetermined gas pressure atmosphere;
the raw data being such that the number of data per hour is 14400000 or more where at least the raw data on power supply output for generation of the discharge are collected at regular sampling intervals, one cycle is set to 6 seconds, and sampling is performed 40 times in each second;
the characteristic value being repeatedly calculated for each cycle, based on the raw data on the power supply output, on five items including a discharge ON time and an average value, a maximum value, a minimum value, and a standard deviation of the power supply output so that one cycle is represented by plot data at one point.

4. A processing data managing system according to any of claims 1 to 3, wherein:
said characteristic value for each of the repeated cycles is data reduced in size with respect to the raw data for each of the repeated cycles.

5. A processing system comprising:
a magnetic disk manufacturing apparatus that performs a same process treatment for each of repeated cycles, a raw data collecting unit for collecting raw data on processing conditions in said processing device, and a processing data managing system according to any of claims 1 to 3 for managing the raw data collected by said raw data collecting unit.

6. A processing system according to claim 5, wherein:

said magnetic disk manufacturing apparatus is provided with a plurality of electrodes in the processing chamber for discharge generation, and said raw data collecting unit collects raw data on a power supply output for discharge generation for each of said electrodes.

7. A processing system according to claim 5, wherein:

said magnetic disk manufacturing apparatus comprises a plurality of processing chambers for forming thin films on the substrate in a predetermined order, and said raw data collecting unit collects raw data on a power supply output for discharge generation for each of said processing chambers.

8. A processing device data managing method comprising:

a step of collecting raw data on process treatment conditions of film forming treatments for magnetic disks in a magnetic disk manufacturing apparatus that performs a same process treatment for each of repeated cycles, a step of processing said raw data into a characteristic value for each of repeated cycles, and a step of storing the characteristic value for each of repeated cycles in a storage, the processing step obtaining the characteristic value for each of repeated cycles by converting the raw data for one cycle into the characteristic value representing characteristics of the raw data for one cycle, the storing step storing the characteristic values for the repeated cycles in the storage so as to visualize time-dependent changes of the characteristic values for the repeated cycles, the magnetic disk manufacturing apparatus being configured to form magnetic disk thin films on the surface of a substrate by generation of discharge in a processing chamber maintained in a predetermined gas pressure atmosphere;

the raw data being such that the number of data per hour is 14400000 or more where at least the raw data on power supply output for generation of the discharge are collected at regular sampling intervals, one cycle is set to 6 seconds, and sampling is performed 40 times in each second:

the characteristic value being repeatedly calculated for each cycle, based on the raw data on the power supply output, on five items including a discharge ON time and an average value, a maximum value, a minimum value, and a standard deviation of the power supply output so that one cycle is represented by plot data at one point.

9. A processing device data managing method comprising:

a step of collecting raw data on process treatment conditions in a magnetic disk manufacturing apparatus that performs a same process treatment for each of repeated cycles, a step of processing said raw data into a characteristic value for each of repeated cycles, and a step of chart-displaying the characteristic value for each of repeated cycles, the processing step obtaining the characteristic value for each of repeated cycles by converting the raw data for one of repeated cycles into the characteristic value representing characteristics of the raw data for one cycle, the chart-displaying step chart-displaying the characteristic value for each of repeated cycles so as to visualize time-dependent changes of the characteristic values for the repeated cycles, the magnetic disk manufacturing apparatus being configured to form magnetic disk thin films on the surface of a substrate by generation of discharge in a processing chamber maintained in a predetermined gas pressure atmosphere;

the raw data being such that the number of data per hour is 14400000 or more where at least the raw data on power supply output for generation of the discharge are collected at regular sampling intervals, one cycle is set to 6 seconds, and sampling is performed 40 times in each second;

the characteristic value being repeatedly calculated for each cycle, based on the raw data on the power supply output, on five items including a discharge ON time and an average value, a maximum value, a minimum value, and a standard deviation of the power supply output so that one cycle is represented by plot data at one point.

* * * * *